US011883858B2

(12) United States Patent
Kawaguchi et al.

(10) Patent No.: US 11,883,858 B2
(45) Date of Patent: *Jan. 30, 2024

(54) SUBSTRATE PROCESSING DEVICE AND SUBSTRATE PROCESSING METHOD

(71) Applicant: SCREEN Holdings Co., Ltd., Kyoto (JP)

(72) Inventors: Kenji Kawaguchi, Kyoto (JP); Toru Endo, Kyoto (JP); Kota Tanikawa, Kyoto (JP)

(73) Assignee: SCREEN Holdings Co., Ltd.

( * ) Notice: Subject to any disclaimer, the term of this patent is extended or adjusted under 35 U.S.C. 154(b) by 26 days.

This patent is subject to a terminal disclaimer.

(21) Appl. No.: 17/704,343

(22) Filed: Mar. 25, 2022

(65) Prior Publication Data

US 2022/0219209 A1 Jul. 14, 2022

Related U.S. Application Data

(63) Continuation of application No. 17/273,123, filed as application No. PCT/JP2019/028345 on Jul. 18, 2019, now Pat. No. 11,318,504.

(51) Int. Cl.
*H01L 21/67* (2006.01)
*B08B 3/08* (2006.01)

(52) U.S. Cl.
CPC .......... *B08B 3/08* (2013.01); *H01L 21/67023* (2013.01)

(58) Field of Classification Search
CPC ........................... B08B 3/08; H01L 21/67023
(Continued)

(56) References Cited

U.S. PATENT DOCUMENTS

2016/0093486 A1 3/2016 Miyazaki et al.
2018/0090306 A1 3/2018 Higashijima et al.
(Continued)

FOREIGN PATENT DOCUMENTS

JP 2006-024793 A 1/2006
JP 2008-095144 A 4/2008
(Continued)

OTHER PUBLICATIONS

JP2010010422A—machine translation (Year: 2010).*
(Continued)

*Primary Examiner* — Tinsae B Ayalew
(74) *Attorney, Agent, or Firm* — OSTROLENK FABER LLP

(57) ABSTRACT

The substrate processing apparatus includes: a nozzle having a spout and adapted to spout SPM from the spout toward a substrate; a mixing portion communicating with the spout; a sulfuric acid-containing liquid supply device which recovers liquid supplied to and expelled from the substrate held by a substrate holding unit, prepares a sulfuric acid-containing liquid from the recovered liquid, and supplies the prepared sulfuric acid-containing liquid to the mixing portion; and a control device. The control device performs: a sulfuric acid-containing liquid preparing step of recovering SPM supplied to and expelled from the substrate and preparing the sulfuric acid-containing liquid; and an SPM spouting step of supplying the prepared sulfuric acid-containing liquid and hydrogen peroxide water to the mixing portion, mixing the sulfuric acid-containing liquid and hydrogen peroxide water together in the mixing portion to prepare SPM, and spouting the prepared SPM from the spout.

20 Claims, 13 Drawing Sheets

(58) Field of Classification Search
USPC .......................................................... 134/198
See application file for complete search history.

(56) References Cited

U.S. PATENT DOCUMENTS

| | | |
|---|---|---|
| 2019/0067048 A1 | 2/2019 | Takaki et al. |
| 2019/0371628 A1 | 12/2019 | Yasuda et al. |

FOREIGN PATENT DOCUMENTS

| | | |
|---|---|---|
| JP | 2010-010422 A | 1/2010 |
| JP | 2012-049391 A | 3/2012 |
| JP | 2012-076979 A | 4/2012 |
| JP | 2013-021198 A | 1/2013 |
| JP | 2013-074090 A | 4/2013 |
| JP | 2013-207207 A | 10/2013 |
| JP | 5668914 B2 | 2/2015 |
| JP | 2016-072613 A | 5/2016 |
| JP | 2018-056293 A | 4/2018 |
| TW | 201830510 A | 8/2018 |
| TW | 201833692 A | 9/2018 |
| TW | 201833995 A | 9/2018 |
| WO | WO 2017/135064 A1 | 8/2017 |

OTHER PUBLICATIONS

International Search Report dated Sep. 24, 2019 in corresponding PCT International Application No. PCT/JP2019/028345.
Written Opinion dated Sep. 24, 2019 in corresponding PCT International Application No. PCT/JP2019/028345.
International Preliminary Report on Patentability (Chapter I) dated Apr. 1, 2021 with Notification from the International Bureau (Form PCT/IB/326) in corresponding PCT International Application No. PCT/JP2019/028345 in Japanese.
English translation of the International Preliminary Report on Patentability (Chapter I) dated Apr. 1, 2021 with Notification from the International Bureau (Form PCT/IB/338) in corresponding PCT International Application No. PCT/JP2019/028345.

* cited by examiner

SUBSTRATE PROCESSING DEVICE AND SUBSTRATE PROCESSING METHOD

CROSS REFERENCE TO RELATED APPLICATIONS

This is a continuation of U.S. patent application Ser. No. 17/273,123, filed Mar. 3, 2021, which is a U.S.C. § 371 national phase conversion of PCT/JP2019/028345, filed Jul. 18, 2019, which claims priority of JP 2018-176394, filed Sep. 20, 2018. Applicant claims priority to each of the foregoing patent applications. The PCT International Application was published in the English language.

TECHNICAL FIELD

The present invention relates to a substrate processing apparatus, and a substrate processing method. Exemplary substrates to be processed include semiconductor wafers, substrates for liquid crystal display devices, substrates for FPDs (Flat Panel Displays) such as organic EL (electroluminescence) display devices, substrates for optical disks, substrates for magnetic disks, substrates for magneto-optical disks, substrates for photomasks, ceramic substrates, and substrates for solar cells.

BACKGROUND ART

In production processes for semiconductor devices and liquid crystal display devices, substrate processing apparatuses are used for processing substrates such as semiconductor wafers and liquid crystal display glass substrates.

The following PTL 1 discloses a substrate processing apparatus of single-substrate processing type, which is adapted to process substrates one by one. The substrate processing apparatus includes a spin chuck which horizontally holds and rotates a substrate, and a nozzle which spouts SPM (a liquid mixture of sulfuric acid and hydrogen peroxide water) toward the substrate held by the spin chuck. PTL 1 also discloses an arrangement for recovering SPM used for treatment of the substrate and reusing the recovered SPM for the subsequent treatment.

CITATION LIST

Patent Literature

PTL 1: JP2006-024793A

SUMMARY OF INVENTION

Problem to be Solved by Invention

In PTL 1, the SPM is recovered from a treatment chamber in which the spin chuck is provided, and is collected in a recovery tank through a recovery line. After foreign matter is removed from the SPM collected in the recovery tank by a filter, the resulting SPM is supplied to a circulation tank. An SPM supply pipe extending to the SPM nozzle is connected to the circulation tank. A pump is provided in an intermediate portion of the SPM supply pipe. Further, a filter, a heater, and an outlet valve are provided downstream of the pump in the SPM supply pipe. An SPM return pipe is branched from the SPM supply pipe at a position between the heater and the outlet valve. A distal portion of the SPM return pipe extends to the circulation tank.

During the operation of the substrate processing apparatus, the pump and a temperature controller are constantly driven. By opening a return valve with the outlet valve closed, the SPM is pumped out from the circulation tank, flows through the SPM supply pipe to the branch position at which the SPM return pipe is branched, and flows back into the circulation tank from the branch position through the SPM return pipe. During a period in which the SPM is not spouted from the SPM nozzle, the SPM is circulated through the circulation tank, the SPM supply pipe, and the SPM return pipe. The temperature of the SPM is adjusted at a predetermined temperature by the circulation of the SPM, and the temperature-adjusted SPM is stored in the circulation tank. When the SPM is spouted from the SPM nozzle, the SPM temperature-adjusted at the predetermined temperature is pumped out from the circulation tank, and supplied to the SPM nozzle through the SPM supply pipe. Then, the SPM spouted from the SPM nozzle is supplied to the substrate.

According to PTL 1, however, if the SPM is repeatedly recovered and reused, the concentrations of sulfuric acid and hydrogen peroxide water contained in the SPM are reduced to levels inappropriate for the reuse.

Particularly, the hydrogen peroxide concentration is remarkably reduced. That is, it is desirable to use the SPM at a higher temperature, because the removal capability of the SPM (the resist removing capability of the SPM) is increased as the temperature of the SPM is increased. However, hydrogen peroxide is liable to decompose into water and oxygen at a higher temperature. For this reason, the hydrogen peroxide concentration is liable to decrease to a level inappropriate for the reuse at a relatively early stage if the SPM is repeatedly recovered and reused.

In any case, the concentrations of sulfuric acid and hydrogen peroxide water contained in the SPM are reduced in the art disclosed in PTL 1. This makes it impossible to efficiently remove the resist from the substrate.

It is therefore an object of the present invention to provide a substrate processing apparatus and a substrate processing method, which can efficiently remove a resist from a substrate by using SPM prepared from a recovered sulfuric acid-containing liquid.

Solution to Problem

The present invention provides a substrate processing apparatus for removing a resist from a substrate with SPM that is a liquid mixture of sulfuric acid and hydrogen peroxide water, the apparatus including: a substrate holding unit which holds a substrate at least partly covered with the resist; a nozzle having a spout and adapted to spout SPM from the spout toward the substrate held by the substrate holding unit; a mixing portion communicating with the spout; a sulfuric acid-containing liquid supply device which recovers liquid supplied to and expelled from the substrate held by the substrate holding unit, prepares a sulfuric acid-containing liquid from the recovered liquid, and supplies the prepared sulfuric acid-containing liquid to the mixing portion; a hydrogen peroxide water supply unit which supplies hydrogen peroxide water to the mixing portion; and a control device which controls the sulfuric acid-containing liquid supply device and the hydrogen peroxide water supply unit; wherein the control device performs a sulfuric acid-containing liquid preparing step of recovering SPM supplied to and expelled from the substrate and preparing the sulfuric acid-containing liquid, and an SPM spouting step of supplying the prepared sulfuric acid-containing liquid and hydrogen peroxide water to the mixing portion, mixing the sulfuric acid-containing liquid and hydrogen peroxide water together in the mixing portion to prepare SPM, and spouting the prepared SPM from the spout.

In the present disclosure, the sulfuric acid-containing liquid is a liquid containing sulfuric acid, and may contain a component other than sulfuric acid. The sulfuric acid-containing liquid contains sulfuric acid at a weight percent concentration of not less than 50%.

With this arrangement, the sulfuric acid-containing liquid, but not the SPM itself, is prepared from the SPM expelled and recovered from the substrate. The prepared sulfuric acid-containing liquid is mixed with hydrogen peroxide water to be thereby reused for the SPM.

In order to increase the removal capability of the SPM, the sulfuric acid concentration of the prepared sulfuric acid-containing liquid is required to fall within a predetermined concentration range. Similarly, the temperature of the prepared sulfuric acid-containing liquid is required to fall within a predetermined temperature range.

By particularly considering sulfuric acid contained in the recovered SPM separately from hydrogen peroxide, the sulfuric acid concentration and the temperature of the sulfuric acid-containing liquid are adjusted and, therefore, the sulfuric acid-containing liquid can be properly prepared as having a sulfuric acid concentration and a temperature falling within the required concentration range and temperature range. Then, the prepared sulfuric acid-containing liquid is mixed with hydrogen peroxide water. Thus, the resist can be efficiently removed from the substrate with the use of the SPM prepared from the recovered sulfuric acid-containing liquid.

In one embodiment of the present invention, the sulfuric acid-containing liquid supply device includes a first liquid storage, and a second liquid storage. The first liquid storage includes a first tank which stores the recovered liquid, and a sulfuric acid adding unit which adds sulfuric acid to the first tank. The second liquid storage includes a second tank which stores liquid supplied from the first tank, a first pipe having opposite ends connected to the second tank so that the liquid stored in the second tank is circulated therethrough, and a first heater which heats the liquid circulated through the second tank and the first pipe. In the sulfuric acid-containing liquid preparing step, the control device performs: a first storing step of recovering the SPM expelled from the substrate and storing the recovered SPM as the sulfuric acid-containing liquid in the first tank; a sulfuric acid adding step of causing the sulfuric acid adding unit to add sulfuric acid to the first tank; a second storing step of storing the sulfuric acid-containing liquid supplied from the first tank in the second tank; and a first heating step of causing the first heater to heat the sulfuric acid-containing liquid circulated through the second tank and the first pipe. In the SPM spouting step, the control device performs the step of supplying the sulfuric acid-containing liquid circulated through the second tank and the first pipe into the mixing portion.

With this arrangement, the SPM expelled and recovered from the substrate is stored as the sulfuric acid-containing liquid in the first tank of the first liquid storage. Further, sulfuric acid from the sulfuric acid adding unit is added to the first tank. Thus, the sulfuric acid concentration of the sulfuric acid-containing liquid stored in the first tank can be accurately adjusted within the required concentration range.

Further, the sulfuric acid-containing liquid supplied from the first liquid storage is circulated through the second tank and the first pipe in the second liquid storage. The sulfuric acid-containing liquid circulated through the second tank and the first pipe is heated by the first heater. Thus, the temperature of the sulfuric acid-containing liquid circulated through the second tank and the first pipe is accurately adjusted within the required temperature range.

The second liquid storage which is solely adapted for the temperature adjustment of the sulfuric acid-containing liquid is provided separately from the first liquid storage in which sulfuric acid can be added to the sulfuric acid-containing liquid (the sulfuric acid concentration of the sulfuric acid-containing liquid can be adjusted). The temperature of sulfuric acid to be added is a room temperature. If the temperature of the sulfuric acid-containing liquid is adjusted in a storage adapted for the temperature adjustment of the sulfuric acid-containing liquid while sulfuric acid is added to the sulfuric acid-containing liquid in the storage, therefore, the temperature of the sulfuric acid-containing liquid will become unstable in the storage. Since the second liquid storage which is solely adapted for the temperature adjustment of the sulfuric acid-containing liquid is provided separately from the first liquid storage in which sulfuric acid can be added to the sulfuric acid-containing liquid, the temperature of the sulfuric acid-containing liquid is stabilized in the second liquid storage. Thus, the temperature of the sulfuric acid-containing liquid to be supplied to the mixing portion can be adjusted within the desired temperature range.

In one embodiment of the present invention, the second liquid storage further includes a sulfuric acid concentration meter which measures the sulfuric acid concentration of the sulfuric acid-containing liquid circulated through the second tank and the first pipe. The control device performs the sulfuric acid adding step if a value of the sulfuric acid concentration measured by the sulfuric acid concentration meter is less than a predetermined threshold.

With this arrangement, the sulfuric acid concentration of the sulfuric acid-containing liquid circulated through the second tank and the first pipe is measured by the concentration meter. Therefore, the sulfuric acid concentration of the sulfuric acid-containing liquid circulated through the second tank and the first pipe can be accurately measured. Thus, the sulfuric acid concentration of the sulfuric acid-containing liquid to be supplied to the mixing portion can be accurately adjusted within the desired concentration range.

In one embodiment of the present invention, the first liquid storage further includes a second pipe having opposite ends connected to the first tank so that the sulfuric acid-containing liquid stored in the first tank is circulated therethrough, and a second heater which heats the sulfuric acid-containing liquid circulated through the first tank and the second pipe. In the sulfuric acid-containing liquid preparing step, the control device further performs a second heating step of causing the second heater to heat the sulfuric acid-containing liquid circulated through the first tank and the second pipe.

With this arrangement, the sulfuric acid-containing liquid is circulated through the first tank and the second pipe in the first liquid storage. The sulfuric acid-containing liquid circulated through the first tank and the second pipe is heated by the second heater. In the first and second liquid storages, the sulfuric acid-containing liquid is heated by the second and first heaters, respectively. Thus, a greater amount of heat can be applied to the sulfuric acid-containing liquid. This makes it possible to increase the temperature of the sulfuric acid-containing liquid to a higher temperature in the second liquid storage.

Since the sulfuric acid-containing liquid is heated by using both of the first and second heaters, a load to be exerted on one of the heaters (i.e., the first heater) can be reduced.

In one embodiment of the present invention, the first liquid storage further includes a second pipe having opposite ends connected to the first tank so that the sulfuric acid-containing liquid stored in the first tank is circulated therethrough. In the first liquid storage, no heating unit is provided for heating the sulfuric acid-containing liquid circulated through the first tank and the second pipe.

With this arrangement, the heating unit for heating the sulfuric acid-containing liquid circulated through the first tank and the second pipe is not provided in the first liquid storage. That is, the sulfuric acid-containing liquid is not heated in the first liquid storage. Therefore, the sulfuric acid-containing liquid circulated through the first tank and the second pipe has a relatively low temperature.

In one embodiment of the present invention, the first liquid storage further includes a filter provided in the second pipe for capturing foreign matter contained in the sulfuric acid-containing liquid flowing through the second pipe.

With this arrangement, the sulfuric acid-containing liquid flowing through the second pipe is filtered by the filter. The sulfuric acid-containing liquid filtered by the filter has a relatively low temperature.

If the sulfuric acid-containing liquid flowing through the first tank and the second pipe has a higher temperature, the higher-temperature sulfuric acid-containing liquid continuously flows through the filter and, therefore, the filter is liable to expand to thereby have a greater pore diameter. If the pores of the filter each have a greater diameter, the diameter of the foreign matter capturable by the filter is increased. This reduces the filtering capability of the filter, making it impossible to properly capture the foreign matter contained in the sulfuric acid-containing liquid in the first liquid storage.

The inventive arrangement suppresses the reduction of the filtering capability of the filter, because the sulfuric acid-containing liquid flowing through the filter has a relatively low temperature. Therefore, the foreign matter contained in the sulfuric acid-containing liquid can be advantageously captured in the first liquid storage. This makes it possible to supply the sulfuric acid-containing liquid in a clean state to the mixing portion.

In one embodiment of the present invention, the sulfuric acid-containing liquid supply device further includes a third liquid storage. The third liquid storage includes a third tank which stores the liquid supplied from the first tank, a third pipe having opposite ends connected to the third tank so that the liquid stored in the third tank is circulated therethrough, and a second heater which heats the liquid circulated through the third tank and the third pipe. In the sulfuric acid-containing liquid preparing step, the control device further performs: a third storing step of storing the sulfuric acid-containing liquid supplied from the first tank in the third tank; and a second heating step of causing the second heater to heat the sulfuric acid-containing liquid circulated through the third tank and the third pipe. In the SPM spouting step, the control device further performs the step of supplying the sulfuric acid-containing liquid circulated through the third tank and the third pipe to the second tank.

With this arrangement, the sulfuric acid-containing liquid supplied from the first liquid storage is circulated through the third tank and the third pipe. The sulfuric acid-containing liquid circulated through the third tank and the third pipe is heated by the second heater. In the third and second liquid storages, the sulfuric acid-containing liquid is heated by the second and first heaters, respectively. Thus, a greater amount of heat can be applied to the sulfuric acid-containing liquid. This makes it possible to heat the sulfuric acid-containing liquid to a higher temperature in the second liquid storage.

Since the sulfuric acid-containing liquid is heated by using both of the first and second heaters, a load to be exerted on the first heater can be reduced.

In one embodiment of the present invention, the first liquid storage further includes a cooler which cools the sulfuric acid-containing liquid circulated through the first tank and the second pipe. In the sulfuric acid-containing liquid preparing step, the control device further performs a cooling step of causing the cooler to cool the sulfuric acid-containing liquid circulated through the first tank and the second pipe.

With this arrangement, the sulfuric acid-containing liquid circulated through the first tank and the second pipe is cooled by the cooler. Therefore, the temperature of the sulfuric acid-containing liquid circulated through the first tank and the second pipe can be reduced to a room temperature or lower than the room temperature.

In this case, the first liquid storage preferably further includes the filter.

With this arrangement, the temperature of the sulfuric acid-containing liquid passing through the filter can be reduced to the room temperature or lower than the room temperature, thereby more effectively suppressing the reduction of the filtering capability. Therefore, the foreign matter contained in the sulfuric acid-containing liquid can be more advantageously captured in the first liquid storage. This makes it possible to supply the sulfuric acid-containing liquid in a cleaner state to the mixing portion.

In one embodiment of the present invention, the sulfuric acid-containing liquid circulated through the first tank and the second pipe is cooled only through natural cooling.

With this arrangement, the sulfuric acid-containing liquid can be cooled without increase in costs.

In one embodiment of the present invention, a first heating temperature to be achieved through the heating by the first heater is higher than a second heating temperature to be achieved through the heating by the second heater.

With this arrangement, the sulfuric acid-containing liquid heated to the second heating temperature in the first liquid storage (or the third liquid storage) is supplied to the second liquid storage. Then, the sulfuric acid-containing liquid is heated to the first heating temperature in the second liquid storage. That is, the sulfuric acid-containing liquid is heated stepwise. This makes it possible to heat the sulfuric acid-containing liquid to a higher temperature in the second liquid storage. Even if the temperature (first heating temperature) of the sulfuric acid-containing liquid to be supplied to the mixing portion is set to an extremely high temperature, the high-temperature sulfuric acid-containing liquid can be properly prepared.

In one embodiment of the present invention, the substrate processing apparatus further includes a sulfuric acid-containing liquid supply pipe which connects the second tank or the first pipe to the mixing portion, and a third heater which heats the sulfuric acid-containing liquid flowing through the sulfuric acid-containing liquid supply pipe. In the sulfuric acid-containing liquid preparing step, the control device performs a third heating step of causing the third heater to heat the sulfuric acid-containing liquid flowing through the sulfuric acid-containing liquid supply pipe.

With this arrangement, the sulfuric acid-containing liquid circulated through the second tank and the first pipe is guided to the sulfuric acid-containing liquid supply pipe. Then, the sulfuric acid-containing liquid flowing through the sulfuric acid-containing liquid supply pipe is heated by the third heater. Through the heating by the third heater, the temperature of the sulfuric acid-containing liquid can be further increased to a higher level than when the sulfuric acid-containing liquid is circulated through the second tank and the first pipe.

In one embodiment of the present invention, the substrate processing apparatus further includes: a mixing ratio changing unit which changes the ratio of the sulfuric acid-containing liquid to hydrogen peroxide water in the mixing portion; a recovery pipe through which the liquid supplied to and expelled from the substrate held by the substrate holding unit is recovered to be supplied to the sulfuric acid-containing liquid supply device; a liquid drain pipe into which the liquid supplied to and expelled from the substrate held by the substrate holding unit flows; and a switching unit which switches, between the liquid drain pipe and the recovery pipe, a pipe into which the liquid expelled from the substrate held by the substrate holding unit flows. The control device further performs: a first SPM supplying step of controlling the mixing ratio changing unit so that a first SPM is prepared by mixing the sulfuric acid-containing liquid and hydrogen peroxide water in a first mixing ratio of the sulfuric acid-containing liquid to hydrogen peroxide water, and supplying the prepared first SPM to the substrate held by the substrate holding unit; a second SPM supplying step of controlling the mixing ratio changing unit so that a second SPM is prepared by mixing the sulfuric acid-containing liquid and hydrogen peroxide water in a second mixing ratio of the sulfuric acid-containing liquid to hydrogen peroxide water that is greater than the first mixing ratio and, after the supply of the first SPM is stopped in the first SPM supplying step, supplying the prepared second SPM to the substrate held by the substrate holding unit; a liquid draining step of controlling the switching unit so that the first SPM supplied to and expelled from the substrate in the first SPM supplying step flows into the liquid drain pipe; and a recovering step of controlling the switching unit so that the second SPM supplied to and expelled from the substrate in the second SPM supplying step flows into the recovery pipe.

With this arrangement, the sulfuric acid-containing liquid and hydrogen peroxide water are mixed in the first mixing ratio for the preparation of the first SPM. The sulfuric acid-containing liquid and hydrogen peroxide water are mixed in the second mixing ratio for the preparation of the second SPM. The first mixing ratio and the second mixing ratio are each defined as the ratio of the volume of the sulfuric acid-containing liquid before the mixing to the volume of hydrogen peroxide water before the mixing. The first mixing ratio is smaller than the second mixing ratio. Therefore, the concentration of hydrogen peroxide contained in the first SPM is higher than the concentration of hydrogen peroxide contained in the second SPM.

The first SPM has a higher hydrogen peroxide concentration and, hence, a higher removal capability than the second SPM. Therefore, the resist can be efficiently removed from the substrate. After the first SPM is supplied to the substrate, the second SPM is supplied to the substrate. The second SPM has a lower removal capability than the first SPM. However, almost all the resist is removed from the substrate by the supply of the first SPM, so that only an easily removable part of the resist remains on the substrate. Therefore, even the second SPM having a lower removal capability can reliably remove the remaining resist from the substrate.

The first SPM supplied to and expelled from the substrate flows into the liquid drain pipe but not into the recovery pipe. The first SPM expelled from the substrate has a relatively high hydrogen peroxide concentration and a relatively low sulfuric acid concentration. In addition, the first SPM expelled from the substrate contains a greater amount of contaminants (carbides of the resist and the like) occurring due to reaction between the first SPM and the resist. Therefore, the first SPM expelled from the substrate is inappropriate for the recovery.

On the other hand, the second SPM expelled from the substrate has a relatively high sulfuric acid concentration. Further, the amount of contaminants contained in the second SPM expelled from the substrate is smaller than the amount of the contaminants contained in the first SPM expelled from the substrate. Therefore, the second SPM having a relatively high sulfuric acid concentration and a smaller contaminant amount is guided into the recovery pipe, and used for the preparation of the sulfuric acid-containing liquid. The prepared sulfuric acid-containing liquid is mixed with hydrogen peroxide water. Thus, sulfuric acid contained in the sulfuric acid-containing liquid reacts with hydrogen peroxide, whereby the SPM is newly prepared. This reduces the amount of the SPM to be discarded.

The SPM is recovered, when the sulfuric acid concentration is higher, i.e., when the ratio of the volume of sulfuric acid before the mixing to the total volume of sulfuric acid and hydrogen peroxide water before the mixing is higher. Therefore, the SPM having a higher sulfuric acid concentration can be recovered. The sulfuric acid concentration is not maintained at a higher level, but the SPM having a higher hydrogen peroxide concentration and a sufficient removal capability is supplied to the substrate before the recovery of the SPM is started. Therefore, the resist can be efficiently removed from the substrate. This makes it possible to recover the SPM having a higher sulfuric acid concentration, while efficiently removing the resist from the substrate.

In one embodiment of the present invention, the substrate processing apparatus further includes: a first guard which is connected to the liquid drain pipe and surrounds the substrate held by the substrate holding unit; and a second guard which is connected to the recovery pipe and surrounds the substrate held by the substrate holding unit. The switching unit includes a guard switching unit which switches the first guard and the second guard between a first state such that the liquid expelled from the substrate is received by the first guard and a second state such that the liquid expelled from the substrate is received by the second guard. The control device further performs: a first SPM capturing step of controlling the guard switching unit to cause the first guard to receive the first SPM expelled from the substrate in the first SPM supplying step; and a second SPM capturing step of controlling the guard switching unit to cause the second guard to receive the second SPM expelled from the substrate in the second SPM supplying step.

With this arrangement, the first SPM expelled from the substrate is received by the first guard surrounding the substrate. The second SPM expelled from the substrate is received by the second guard surrounding the substrate. The first SPM received by the first guard flows into the liquid drain pipe connected to the first guard. The second SPM received by the second guard flows into the recovery pipe connected to the second guard.

The first SPM expelled from the substrate contains a greater amount of contaminants. Therefore, the contaminants are liable to remain on the inner wall of the first guard after the first SPM is received by the first guard. When the second SPM expelled from the substrate is received and recovered by the first guard, the second SPM is liable to be contaminated with the contaminants adhering to the first guard. Therefore, the second SPM is received by the second guard different from the first guard, whereby the amount of the contaminants to be contained in the recovered SPM can be reduced.

The present invention provides a substrate processing method to be performed by a substrate processing apparatus including a nozzle which spouts SPM that is a liquid mixture of sulfuric acid and hydrogen peroxide water from its spout toward a substrate held by a substrate holding unit, and a mixing portion communicating with the spout, the method including: a sulfuric acid-containing liquid preparing step of preparing a sulfuric acid-containing liquid by recovering SPM supplied to and expelled from the substrate held by the substrate holding unit, the substrate being at least partly covered with a resist; and an SPM spouting step of supplying the prepared sulfuric acid-containing liquid and hydrogen peroxide water to the mixing portion, mixing the sulfuric acid-containing liquid and hydrogen peroxide water in the mixing portion to prepare SPM, and spouting the prepared SPM from the spout.

According to this method, the sulfuric acid-containing liquid, but not the SPM itself, is prepared from the SPM expelled and recovered from the substrate. The prepared sulfuric acid-containing liquid is mixed with hydrogen peroxide water to be thereby reused for the SPM.

In order to increase the removal capability of the SPM, the sulfuric acid concentration of the prepared sulfuric acid-containing liquid is required to fall within a predetermined concentration range. Similarly, the temperature of the prepared sulfuric acid-containing liquid is required to fall within a predetermined temperature range.

By particularly considering sulfuric acid contained in the recovered SPM separately from hydrogen peroxide, the sulfuric acid concentration and the temperature of the sulfuric acid-containing liquid are adjusted and, therefore, the sulfuric acid-containing liquid can be properly prepared as having a sulfuric acid concentration and a temperature falling within the required concentration range and temperature range. Then, the prepared sulfuric acid-containing liquid is mixed with hydrogen peroxide water. Thus, the resist can be efficiently removed from the substrate with the use of the SPM prepared from the recovered sulfuric acid-containing liquid.

In one embodiment of the present invention, the sulfuric acid-containing liquid preparing step includes: the step of recovering the SPM expelled from the substrate and storing the recovered SPM as the sulfuric acid-containing liquid in a first tank of a first liquid storage; a sulfuric acid adding step of adding sulfuric acid to the first tank; the step of storing the sulfuric acid-containing liquid from the first tank in a second tank of a second liquid storage different from the first tank; and a heating step of heating a sulfuric acid-containing liquid circulated through the second tank and a first pipe having opposite ends connected to the second tank by a first heater of the second liquid storage. The SPM spouting step includes the step of supplying the sulfuric acid-containing liquid circulated through the second tank and the first pipe to the mixing portion.

According to this method, the SPM expelled and recovered from the substrate is stored as the sulfuric acid-containing liquid in the first tank of the first liquid storage. Further, sulfuric acid from a sulfuric acid adding unit is added to the first tank. Thus, the sulfuric acid concentration of the sulfuric acid-containing liquid stored in the first tank can be accurately adjusted within the required concentration range.

Further, the sulfuric acid-containing liquid supplied from the first liquid storage is circulated through the second tank and the first pipe in the second liquid storage. The sulfuric acid-containing liquid circulated through the second tank and the first pipe is heated by the first heater. Thus, the temperature of the sulfuric acid-containing liquid circulated through the second tank and the first pipe can be accurately adjusted within the required temperature range.

The second liquid storage which is solely adapted for the temperature adjustment of the sulfuric acid-containing liquid is provided separately from the first liquid storage in which sulfuric acid can be added to the sulfuric acid-containing liquid (the sulfuric acid concentration of the sulfuric acid-containing liquid can be adjusted). The temperature of sulfuric acid to be added is a room temperature. If the temperature of the sulfuric acid-containing liquid is adjusted in a storage adapted for the temperature adjustment of the sulfuric acid-containing liquid while sulfuric acid is added to the sulfuric acid-containing liquid in the storage, therefore, the temperature of the sulfuric acid-containing liquid will become unstable in the storage. Since the second liquid storage which is solely adapted for the temperature adjustment of the sulfuric acid-containing liquid is provided separately from the first liquid storage in which sulfuric acid can be added to the sulfuric acid-containing liquid, the temperature of the sulfuric acid-containing liquid is stabilized in the second liquid storage. Thus, the temperature of the sulfuric acid-containing liquid to be supplied to the mixing portion can be adjusted within the desired temperature range.

In one embodiment of the present invention, the substrate processing method further includes: a first SPM supplying step of changing the ratio of the sulfuric acid-containing liquid to hydrogen peroxide water in the mixing portion, mixing the sulfuric acid-containing liquid and hydrogen peroxide water in a first mixing ratio of the sulfuric acid-containing liquid to hydrogen peroxide water to prepare a first SPM, and supplying the prepared first SPM to the substrate held by the substrate holding unit; a second SPM supplying step of changing the ratio of the sulfuric acid-containing liquid to hydrogen peroxide water in the mixing portion, mixing the sulfuric acid-containing liquid and hydrogen peroxide water in a second mixing ratio of the sulfuric acid-containing liquid to hydrogen peroxide water that is greater than the first mixing ratio to prepare a second SPM and, after the supply of the first SPM is stopped in the first SPM supplying step, supplying the prepared second SPM to the substrate held by the substrate holding unit; a liquid draining step of causing the first SPM supplied to and expelled from the substrate in the first SPM supplying step to flow into a liquid drain pipe different from a recovery pipe through which the liquid supplied to and expelled from the substrate held by the substrate holding unit is recovered to be supplied to the sulfuric acid-containing liquid supply device; and a recovering step of causing the second SPM supplied to and expelled from the substrate in the second SPM supplying step to flow into the recovery pipe.

According to this method, the sulfuric acid-containing liquid and hydrogen peroxide water are mixed in the first mixing ratio for the preparation of the first SPM. The sulfuric acid-containing liquid and hydrogen peroxide water are mixed in the second mixing ratio for the preparation of the second SPM. The first mixing ratio and the second mixing ratio are each defined as the ratio of the volume of the sulfuric acid-containing liquid before the mixing to the volume of hydrogen peroxide water before the mixing. The first mixing ratio is smaller than the second mixing ratio. Therefore, the concentration of hydrogen peroxide contained in the first SPM is higher than the concentration of hydrogen peroxide contained in the second SPM.

The first SPM has a higher hydrogen peroxide concentration and, hence, a higher removal capability than the second SPM. Therefore, the resist can be efficiently removed from the substrate. After the first SPM is supplied to the substrate, the second SPM is supplied to the substrate. The second SPM has a lower removal capability than the first SPM. However, almost all the resist is removed from the substrate by the supply of the first SPM, so that only an easily removable part of the resist remains on the substrate. Therefore, even the second SPM having a lower removal capability can reliably remove the remaining resist.

The first SPM supplied to and expelled from the substrate flows into the liquid drain pipe but not into the recovery pipe. The first SPM expelled from the substrate has a relatively high hydrogen peroxide concentration and a relatively low sulfuric acid concentration. In addition, the first SPM expelled from the substrate contains a greater amount of contaminants (carbides of the resist and the like) occurring due to reaction between the first SPM and the resist. Therefore, the first SPM expelled from the substrate is inappropriate for the recovery.

On the other hand, the second SPM expelled from the substrate has a relatively high sulfuric acid concentration. Further, the amount of contaminants contained in the second SPM expelled from the substrate is smaller than the amount of the contaminants contained in the first SPM expelled from the substrate. Therefore, the second SPM having a relatively high sulfuric acid concentration and a smaller contaminant amount is guided into the recovery pipe, and used for the preparation of the sulfuric acid-containing liquid. The prepared sulfuric acid-containing liquid is mixed with hydrogen peroxide water. Thus, sulfuric acid contained in the sulfuric acid-containing liquid reacts with hydrogen peroxide, whereby the SPM is newly prepared. This reduces the amount of the SPM to be discarded.

The SPM is recovered, when the sulfuric acid concentration is higher, i.e., when the ratio of the volume of sulfuric acid before the mixing to the total volume of sulfuric acid and hydrogen peroxide water before the mixing is higher. Therefore, the SPM having a higher sulfuric acid concentration can be recovered. The sulfuric acid concentration is not maintained at a higher level, but the SPM having a higher hydrogen peroxide concentration and a sufficient removal capability is supplied to the substrate before the recovery of the SPM is started. Therefore, the resist can be efficiently removed. This makes it possible to recover the SPM having a higher sulfuric acid concentration, while efficiently removing the resist from the substrate.

In one embodiment of the present invention, the substrate processing method further includes: a first SPM capturing step of receiving the first SPM expelled from the substrate in the first SPM supplying step by a first guard surrounding the substrate and connected to the liquid drain pipe; and a second SPM capturing step of receiving the second SPM expelled from the substrate in the second SPM supplying step by a second guard surrounding the substrate and connected to the recovery pipe.

According to this method, the first SPM expelled from the substrate is received by the first guard surrounding the substrate. The second SPM expelled from the substrate is received by the second guard surrounding the substrate. The first SPM received by the first guard flows into the liquid drain pipe connected to the first guard. The second SPM received by the second guard flows into the recovery pipe connected to the second guard.

The first SPM expelled from the substrate contains a greater amount of contaminants. Therefore, the contaminants are liable to remain on the inner wall of the first guard after the first SPM is received by the first guard. When the second SPM expelled from the substrate is received and recovered by the first guard, the second SPM is liable to be contaminated with the contaminants adhering to the first guard. Therefore, the second SPM is received by the second guard different from the first guard, whereby the amount of the contaminants to be contained in the recovered SPM can be reduced.

The foregoing and other objects, features, and effects of the present invention will become more apparent from the following description of embodiments with reference to the attached drawings.

DESCRIPTION OF EMBODIMENTS

Figure 1:
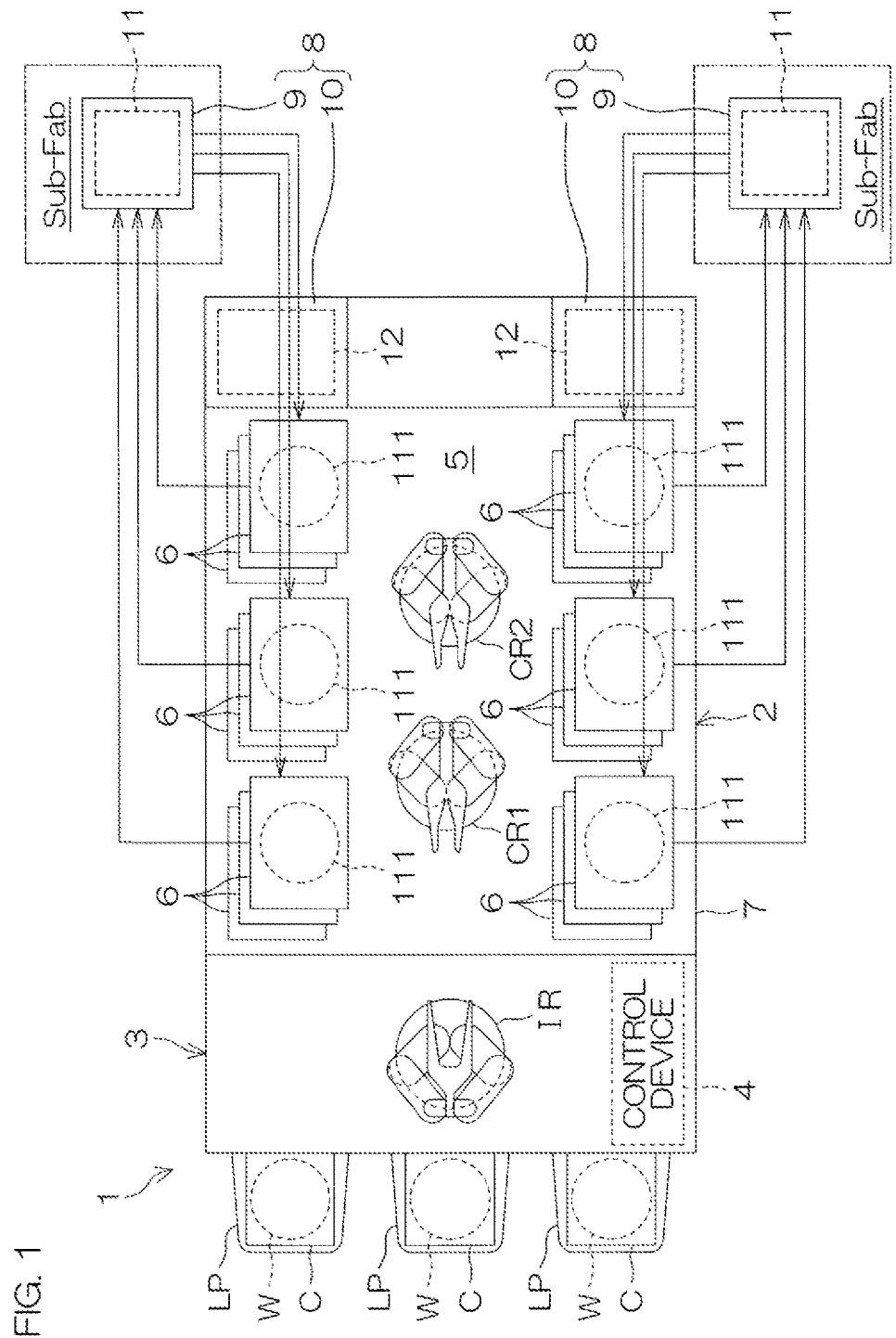
FIG. 1 is a schematic diagram of a substrate processing apparatus according to a first embodiment of the present invention as seen from the top.

FIG. 1 is a schematic diagram of a substrate processing apparatus 1 according to a first embodiment of the present invention as seen from the top.

The substrate processing apparatus 1 is an apparatus of a single-substrate processing type for processing disk-shaped substrates W such as semiconductor wafers one by one. The substrate processing apparatus 1 includes an apparatus main body 2 disposed in a clean room, an indexer unit 3 connected to the apparatus main body 2, a treatment liquid supply device, and a control device 4 which controls the substrate processing apparatus 1.

The indexer unit 3 includes a plurality of load ports LP which respectively hold a plurality of carriers C each containing substrates W, and an indexer robot IR which transports a substrate W with respect to each of the carriers C.

The apparatus main body 2 includes a transport chamber 5, and a plurality of treatment units 6 in which the substrates W transported from the plurality of load ports LP are treated with a treatment fluid such as a treatment liquid or a treatment gas. The plurality of treatment units 6 define six towers, which are disposed at six positions horizontally spaced from each other. The towers each include a plurality of treatment units 6 (e.g., three treatment units 6) vertically stacked one on another. The six towers are disposed three by three on opposite sides of the transport chamber 5. The treatment units 6 are located inside an outer wall 7 of the apparatus main body 2, i.e., are surrounded by the outer wall 7.

The substrate processing apparatus 1 includes a first substrate transport robot CR1 and a second substrate transport robot CR2 in addition to the indexer robot IR as transport robots. The first substrate transport robot CR1 and the second substrate transport robot CR2 are disposed in the transport chamber 5. The indexer robot IR transports substrates W between the load ports LP and the first substrate transport robot CR1. The indexer robot IR includes a hand which supports a substrate W. The first substrate transport robot CR1 transports substrates W between the indexer robot IR and the treatment units 6 of two of the towers located closest to the load ports LP, and transports substrates W between the indexer robot IR and the second substrate transport robot CR2. The second substrate transport robot CR2 transports substrates W between the transport units 6 of the other four towers located opposite from the load ports LP and the indexer robot IR. The first substrate transport robot CR1 and the second substrate transport robot CR2 each include a hand which supports a substrate W.

The treatment liquid supply device supplies the treatment liquid (a sulfuric acid-containing liquid (an etching liquid or a cleaning liquid) to the treatment units 6. The treatment liquid supply device includes sulfuric acid-containing liquid supply devices 8 which supply the sulfuric acid-containing liquid containing sulfuric acid to the treatment units 6. The sulfuric acid-containing liquid supply devices 8 recover the sulfuric acid-containing liquid from the treatment units 6, then condition the recovered liquid as the sulfuric acid-containing liquid, and supply the conditioned sulfuric acid-containing liquid to the treatment units 6. The sulfuric acid-containing liquid supply devices 8 each include a first sulfuric acid-containing liquid supply device 9 disposed outside the clean room, and a second sulfuric acid-containing liquid supply device 10 disposed outside the outer wall 7 in the clean room.

In this embodiment, the substrate processing apparatus 1 includes two first sulfuric acid-containing liquid supply devices 9. The two first sulfuric acid-containing liquid supply devices 9 are disposed in a so-called Sub-Fab which is a space beneath the clean room. The first sulfuric acid-containing liquid supply devices 9 are each associated with the three towers disposed on each side of the transport chamber 5. The first sulfuric acid-containing liquid supply devices 9 are each supplied with SPM drained from the treatment units 6 of the three towers associated therewith. The first sulfuric acid-containing liquid supply devices 9 each include a first liquid storage 11 which recovers the SPM drained from the treatment units 6 and then stores the recovered SPM as the sulfuric acid-containing liquid to condition the sulfuric acid-containing liquid in a predetermined state.

A second sulfuric acid-containing liquid supply device 10 is provided in association with each of the first sulfuric acid-containing liquid supply devices 9. That is, the substrate processing apparatus 1 includes two second sulfuric acid-containing liquid supply devices 10.

The second sulfuric acid-containing liquid supply devices 10 are supplied with the sulfuric acid-containing liquid from the first sulfuric acid-containing liquid supply devices 9 associated therewith. The second sulfuric acid-containing liquid supply devices 10 each include a second liquid storage 12 which stores the sulfuric acid-containing liquid supplied from the first liquid storage 11 and conditions the sulfuric acid-containing liquid at a predetermined sulfuric acid concentration and a predetermined temperature. The sulfuric acid-containing liquid conditioned by the second liquid storage 12 is supplied to an SPM nozzle (nozzle) 13 (see FIGS. 2 and 4) of each of the treatment units 6. To the SPM nozzle 13, hydrogen peroxide water is supplied from a hydrogen peroxide water supply unit 122 (see FIG. 4). The sulfuric acid-containing liquid and hydrogen peroxide water supplied to the SPM nozzle 13 are mixed together in the SPM nozzle 13 (mixing portion), whereby SPM is prepared. The SPM is spouted from a spout 13a (see FIG. 5) provided at a lower portion of the SPM nozzle 13. The spout 13a communicates with the inside of the SPM nozzle 13. In the treatment unit 6, the SPM spouted from the spout 13a is supplied to the substrate W. Thus, a resist is removed from the substrate W.

In the sulfuric acid-containing liquid supply device 8, the sulfuric acid-containing liquid, but not the SPM itself, is prepared from the SPM expelled and recovered from the substrate W (sulfuric acid-containing liquid preparing step). The prepared sulfuric acid-containing liquid is reused to be mixed with hydrogen peroxide water for use as the SPM.

In order to increase the removal capability of the SPM, the sulfuric acid concentration of the prepared sulfuric acid-containing liquid is required to fall within a predetermined concentration range. Similarly, the temperature of the prepared sulfuric acid-containing liquid is required to fall within a predetermined temperature range.

In the sulfuric acid-containing liquid supply device 8, the sulfuric acid concentration and the temperature of the sulfuric acid-containing liquid are adjusted by particularly considering sulfuric acid contained in the recovered SPM separately from hydrogen peroxide and, therefore, the sulfuric acid-containing liquid can be properly prepared as having a sulfuric acid concentration and a temperature falling within the required concentration range and temperature range.

Then, the prepared sulfuric acid-containing liquid is mixed with hydrogen peroxide water in the SPM nozzle 13, whereby the SPM is prepared. The prepared SPM is spouted from the SPM nozzle 13 to be supplied to the substrate W (SPM spouting step). Thus, the resist can be efficiently removed from the substrate W with the use of the SPM prepared from the recovered sulfuric acid-containing liquid.

Figure 2:
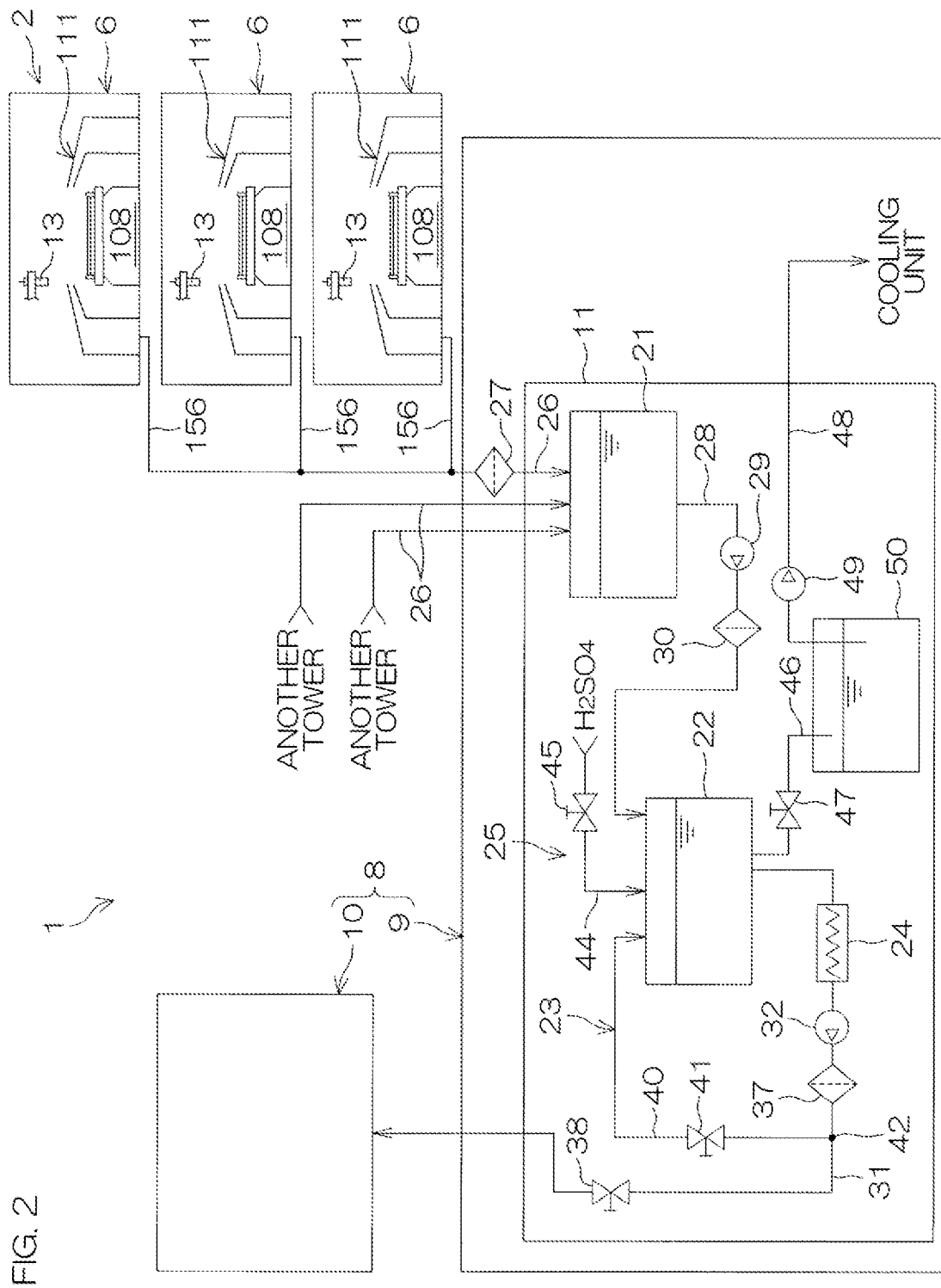
FIG. 2 is a diagram of a first sulfuric acid-containing liquid supply device and an apparatus main body shown in FIG. 1 as seen in a horizontal direction.
Figure 3:
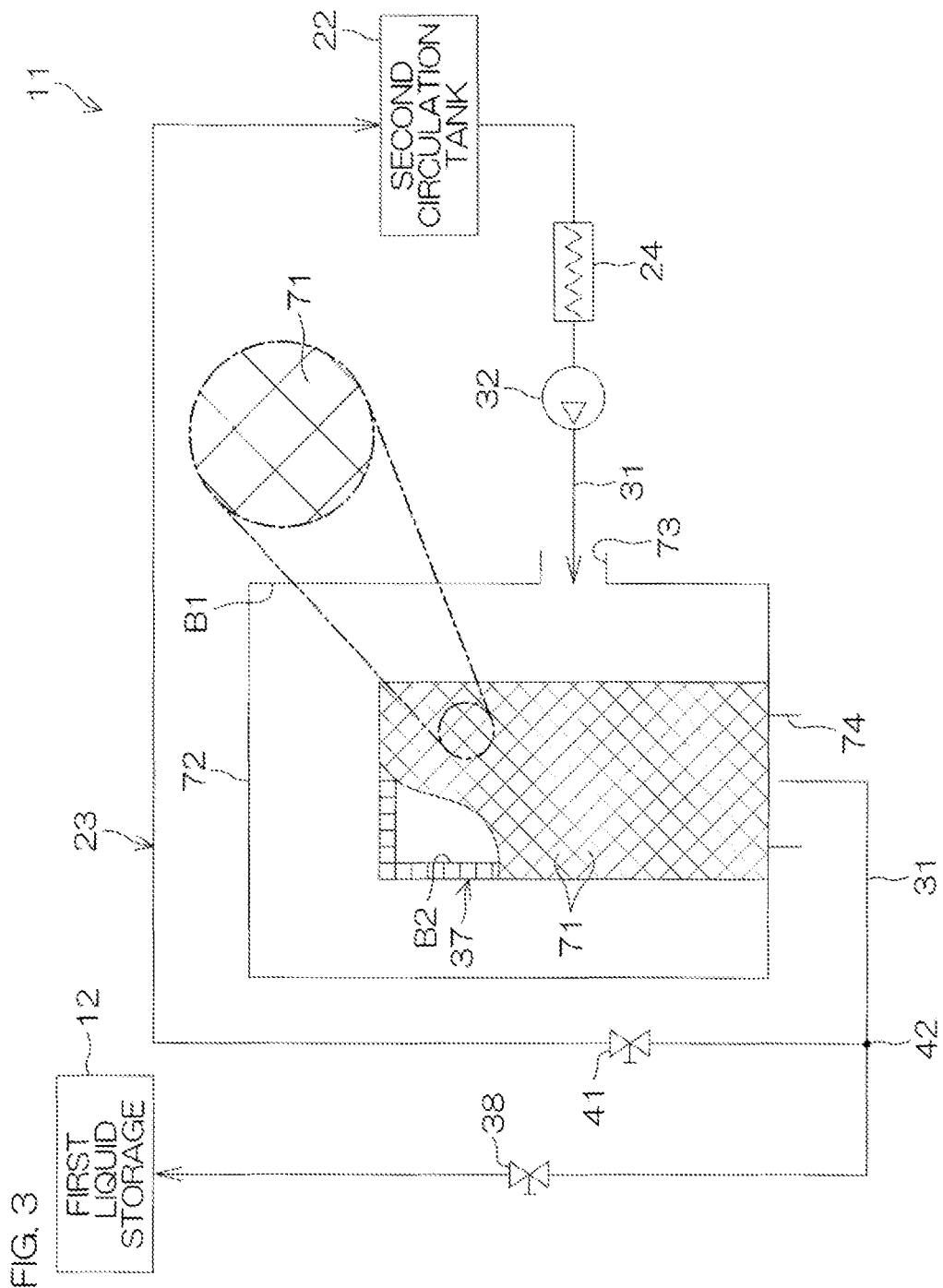
FIG. 3 is a sectional view showing the structure of a third capturing filter shown in FIG. 2 on an enlarged scale.

FIG. 2 is a diagram of the first sulfuric acid-containing liquid supply device 9 and the apparatus main body 2 shown in FIG. 1 as seen in a horizontal direction. FIG. 3 is a sectional view showing the structure of a third capturing filter 37 shown in FIG. 2 on an enlarged scale.

As shown in FIG. 2, the first liquid storage 11 of the first sulfuric acid-containing liquid supply device 9 includes a reclaim tank 21, a first circulation tank (first tank) 22, a first circulation pipe (second pipe) 23, a first circulation heater (second heater) 24, and a sulfuric acid adding unit 25.

As shown in FIG. 2, the SPM recovered from a total of nine treatment units 6 of the associated three towers is stored as the sulfuric acid-containing liquid in the reclaim tank 21. Specifically, a downstream end of a recovery outlet pipe 26 connected to recovery pipes 156 to be described later is connected to the reclaim tank 21. SPM recovered in treatment cups 111 of the respective treatment units 6 is guided to the reclaim tank 21 through the respective recovery pipes 156 and the recovery outlet pipe 26, and stored as the sulfuric acid-containing liquid in the reclaim tank 21. A first capturing filter 27 which captures and removes foreign matter from the SPM flowing through the recovery outlet pipe 26 is provided in the recovery outlet pipe 26. The first capturing filter 27 is a filter for capturing relatively large foreign matter contained in the SPM. The first capturing filter 27 has substantially the same structure as a third capturing filter 37 to be described later. The first capturing filter 27 has pores 71 (to be described later with reference to FIG. 3) each having a greater diameter than a second capturing filter 30 (to be described later) and the third capturing filter (filter) 37. The recovery outlet pipe 26 vertically extends, so that the SPM flowing through the recovery outlet pipe 26 is forced against the first capturing filter 27 by the gravity of the SPM. Thus, the first capturing filter 27 captures relatively large foreign matter. Then, the SPM removed of the relatively large foreign matter is stored as the sulfuric acid-containing liquid in the reclaim tank 21.

Downstream ends of three recovery outlet pipes 26 respectively associated with the three towers are connected to the reclaim tank 21. In FIG. 2, an arrangement for only one tower is shown in detail. The other two towers are not described in detail, but each designated simply as "another tower" in FIG. 2.

As shown in FIG. 2, a transport pipe 28 is connected at its upstream end to the reclaim tank 21, and connected at its downstream end to the first circulation tank 22. A first liquid pumping device 29 such as a pump for pumping out the sulfuric acid-containing liquid from the reclaim tank 21, and a second capturing filter 30 for capturing and removing relatively small foreign matter from the sulfuric acid-containing liquid flowing through the transport pipe are provided in the transport pipe 28. The second capturing filter 30 has substantially the same structure as the third capturing filter 37 to be described layer. The second capturing filter 30 has substantially the same pore diameter as the diameter of each of the pores 71 (see FIG. 3) of the third capturing filter 37. As shown in FIG. 2, the first liquid pumping device 29 and the second capturing filter 30 are disposed in this order from the side of the reclaim tank 21. Therefore, the sulfuric acid-containing liquid flowing through the transport pipe 28 is forced against the second capturing filter 30 by the pumping force of the first liquid pumping device 29. Thus, the foreign matter can be captured by the second capturing filter 30. The sulfuric acid-containing liquid is supplied from the reclaim tank 21 to the first circulation tank 22 through the transport pipe 28, and stored in the first circulation tank 22 (first storing step).

As shown in FIG. 2, a first liquid guide pipe 31 extending toward the second sulfuric acid-containing liquid supply device 10 (toward the second liquid storage 12) is connected to the first circulation tank 22. A second liquid pumping device 32 such as a pump for pumping out the sulfuric acid-containing liquid from the first circulation tank 22 is provided in the first liquid guide pipe 31. The third capturing filter 37 and an on/off valve 38 are provided downstream of the second liquid pumping device 32 in the first liquid guide pipe 31. The third capturing filter 37 is a filter for capturing and removing relatively small foreign matter from the sulfuric acid-containing liquid flowing through the first liquid guide pipe 31. The third capturing filter 37 removes foreign matter that cannot be removed by the second capturing filter 30.

As shown in FIG. 3, the third capturing filter 37 is, for example, a tubular filter having a blocked downstream end, e.g., a filter of standard blocking type. A plurality of pores 71 are provided in the entire third capturing filter 37 as each extending thicknesswise through the third capturing filter 37. The pores 71 of the third capturing filter 37 each have, for example, a square shape, but may otherwise be a polygonal shape, a round shape, or an oval shape, as seen thicknesswise of the third capturing filter 37.

As shown in FIG. 3, the third capturing filter 37 is removably attached to a housing 72 which holds the third capturing filter 37 therein. The housing 72 includes an inlet portion 73 connected to a downstream end of a pipe portion (of the first liquid guide pipe 31) upstream of the third capturing filter 37, and an outlet portion 74 connected to an upstream end of a pipe portion (of the first liquid guide pipe 31) downstream of the third capturing filter 37.

As shown in FIG. 3, the third capturing filter 37 partitions an inside space of the housing 72 into an upstream space B1 of the third capturing filter 37 through which the sulfuric acid-containing liquid to be filtered flows, and a downstream space B2 of the third capturing filter 37 through which the filtered sulfuric acid-containing liquid flows. The sulfuric acid-containing liquid flowing through the first liquid guide pipe 31 is forced against the third capturing filter 37 by the pumping force of the second liquid pumping device 32. Thus, the sulfuric acid-containing liquid flows from the upstream space B1 to the downstream space B2 to pass through the pores 71 of the third capturing filter 37. Thus, the sulfuric acid-containing liquid is filtered by the third capturing filter 37. The foreign matter contained in the sulfuric acid-containing liquid present in the upstream space B1 is adsorbed on a wall surface of the third capturing filter 37 having the pores 71 defined therein to be thereby captured in the pores 71. Thus, the foreign matter is removed by the third capturing filter 37.

As shown in FIG. 2, the on/off valve 38 is a valve for controlling the on and off of the flow of the sulfuric acid-containing liquid in the first liquid guide pipe 31.

As shown in FIG. 2, a return pipe 40 is branched from the first liquid guide pipe 31 at a position between the on/off valve 38 and the third capturing filter 37. A downstream portion of the return pipe 40 extends to the first circulation tank 22. A return valve 41 is provided in the return pipe 40. The first circulation pipe 23 is constituted by the return pipe 40 and a portion of the first liquid guide pipe 31 upstream of the branch position 42 at which the return pipe 40 is branched.

As shown in FIG. 2, the sulfuric acid adding unit 25 is a unit which supplies fresh sulfuric acid (sulfuric acid yet to be used for the treatment of the substrates W) to the first circulation tank 22. The sulfuric acid adding unit 25 includes a sulfuric acid addition pipe 44 through which sulfuric acid is added to the first circulation tank 22, and a sulfuric acid addition valve 45 which opens and closes the sulfuric acid addition pipe 44. Sulfuric acid to be added is unused sulfuric acid (e.g., concentrated sulfuric acid) having a sulfuric acid concentration that is higher than the sulfuric acid concentration of the sulfuric acid-containing liquid in the first circulation tank 22. The temperature of sulfuric acid to be added is a room temperature (about 23° C. to about 25° C.)

During the operation of the substrate processing apparatus 1 (including a period in which the treatment of the substrates W is halted), the second liquid pumping device 32 and the first circulation heater 24 are constantly driven. With the on/off valve 38 closed and with the return valve 41 open, therefore, the sulfuric acid-containing liquid pumped out from the first circulation tank 22 flows to the branch position 42 through the first liquid guide pipe 31, and then flows back to the first circulation tank 22 from the branch position 42 through the return pipe 40. That is, the sulfuric acid-containing liquid is circulated through the first circulation tank 22 and the first circulation pipe 23 during a period in which the sulfuric acid-containing liquid is not supplied to the second liquid storage 12. When the sulfuric acid-containing liquid is supplied to the second liquid storage 12, the sulfuric acid-containing liquid pumped out from the first circulation tank 22 is supplied to the second liquid storage through the first liquid guide pipe 31 by opening the on/off valve 38 and closing the return valve 41.

As shown in FIG. 2, the first circulation heater 24 is provided upstream of the second liquid pumping device 32 in the first liquid guide pipe 31. The first circulation heater 24 heats the sulfuric acid-containing liquid circulated through the first circulation tank 22 and the first circulation pipe 23 (second heating step). The heating temperature of the first circulation heater 24 is set to a predetermined first temperature (second heating temperature, e.g., about 120° C. to about 130° C.). The sulfuric acid-containing liquid is circulated through the first circulation tank 22 and the first circulation pipe 23, whereby the sulfuric acid-containing liquid is conditioned at the first temperature. During the period in which the sulfuric acid-containing liquid is not supplied to the second liquid storage 12, the sulfuric acid-containing liquid conditioned at the first temperature can be stored in the first circulation tank 22 by the circulation of the sulfuric acid-containing liquid. After the on/off valve 38 is opened, the sulfuric acid-containing liquid conditioned at the first temperature can be supplied to the second liquid storage 12.

As shown in FIG. 2, the first liquid storage 11 further includes a liquid drain tank 50. A liquid drain pipe 46 extending to the liquid drain tank 50 is connected to the first circulation tank 22. A liquid drain valve 47 which opens and closes the liquid drain pipe 46 is provided in the liquid drain pipe 46. Where the sulfuric acid-containing liquid stored in the first circulation tank 22 is no longer used for the treatment of the substrates W, the liquid drain valve 47 is opened, whereby the sulfuric acid-containing liquid stored in the first circulation tank 22 is drained from the first circulation tank 22 and guided to the liquid drain tank 50 to be stored in the liquid drain tank 50.

As shown in FIG. 2, an outlet pipe 48 extends from the liquid drain tank 50, and a downstream end of the outlet pipe 48 is connected to a cooling unit (not shown). A third liquid pumping device 49 such as a pump is provided in the outlet pipe 48. With the third liquid pumping device 49 driven, the sulfuric acid-containing liquid stored in the liquid drain tank 50 is pumped out into the outlet pipe 48 to be supplied to the cooling unit. The sulfuric acid-containing liquid is cooled by the cooling unit, and then guided to a waste liquid disposal device (not shown) provided outside the apparatus to be treated in the waste liquid disposal device.

The first liquid storage 11 has thus been described. In the first liquid storage 11, the SPM recovered from the treatment units 6 is stored as the sulfuric acid-containing liquid in the first circulation tank 22. The sulfuric acid-containing liquid stored in the first circulation tank 22 is circulated through the first circulation pipe 23. Further, sulfuric acid from the sulfuric acid adding unit 25 is added to the first circulation tank 22. With the provision of the sulfuric acid adding unit 25, the first liquid storage 11 may be regarded as a storage adapted for the adjustment of the sulfuric acid concentration.

Figure 4:
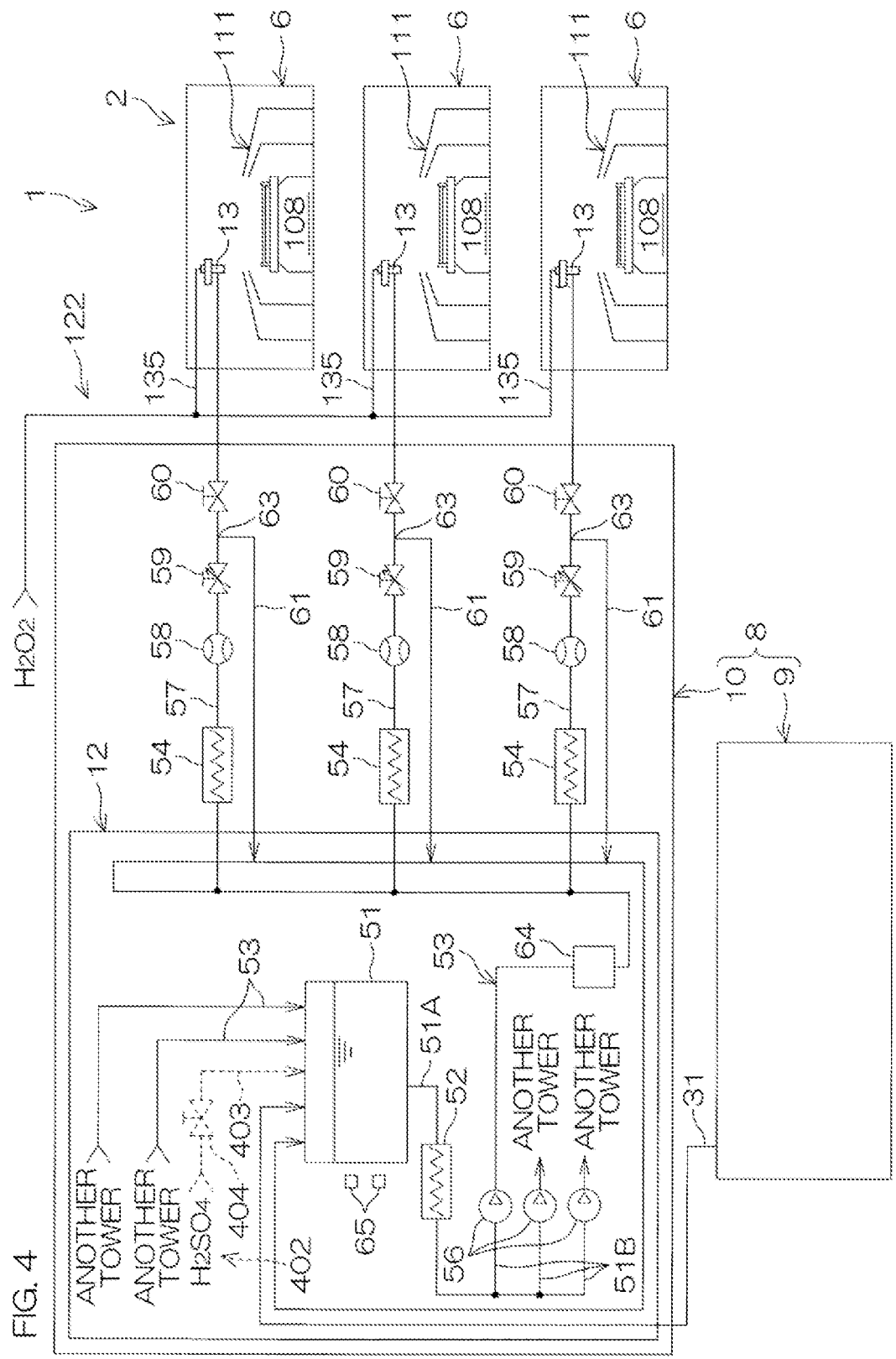
FIG. 4 is a diagram of a second sulfuric acid-containing liquid supply device and the apparatus main body shown in FIG. 1 as seen in a horizontal direction.

FIG. 4 is a diagram of the second sulfuric acid-containing liquid supply device 10 and the apparatus main body 2 shown in FIG. 1 as seen in a horizontal direction.

The second liquid storage 12 of the second sulfuric acid-containing liquid supply device 10 includes a second circulation tank (second tank) 51, a second circulation heater (first heater) 52, second circulation pipes 53, and heaters (third heater) 54.

A downstream end of the first liquid guide pipe 31 is connected to the second circulation tank 51. The sulfuric acid-containing liquid conditioned at the first temperature (e.g., about 120° C. to about 130° C.) in the first liquid storage 11 is guided into the second circulation tank 51. Then, the guided sulfuric acid-containing liquid is stored in the second circulation tank 51 (second storing step).

A liquid amount meter 65 having a plurality of sensors located at different height positions is attached to the second circulation tank 51. The liquid amount meter 65 detects the liquid surface height of the sulfuric acid-containing liquid stored in the second circulation tank 51.

A common pipe 51A is connected to the second circulation tank 51. The second circulation heater 52 is provided in the common pipe 51A.

Three sulfuric acid-containing liquid flowing pipes 51B are connected to the second circulation tank 51 through the common pipe 51A. Specifically, upstream ends of the three sulfuric acid-containing liquid flowing pipes 51B for supplying the sulfuric acid-containing liquid to the corresponding towers are connected to a downstream end portion of the common pipe 51A. Downstream ends of the three sulfuric acid-containing liquid flowing pipes 51B are connected to the second circulation tank 51. The second circulation pipes 53 are constituted by the common pipe 51A and the respective sulfuric acid-containing liquid flowing pipes 51B. Fourth liquid pumping devices 56 for pumping out the sulfuric acid-containing liquid from the common pipe 51A are respectively provided in the sulfuric acid-containing liquid flowing pipes 51B. The sulfuric acid-containing liquid pumped out into the second circulation pipes 53 by the fourth liquid pumping devices 56 flows from the upstream ends to the downstream ends of the sulfuric acid-containing liquid flowing pipes 51B back into the second circulation tank 51. Thus, the sulfuric acid-containing liquid is circulated through the second circulation tank 51 and the second circulation pipes 53 (the common pipe 51A and the sulfuric acid-containing liquid flowing pipes 51B).

In FIG. 4, an arrangement for only one tower is shown in detail. The other two towers are not described in detail, but each designated simply as "another towers" in FIG. 4.

The second circulation heater 52 heats the sulfuric acid-containing liquid circulated through the second circulation tank 51 and the second circulation pipes 53 (the common pipe 51A and the sulfuric acid-containing liquid flowing pipes 51B) (first heating step). The heating temperature of the second circulation heater 52 is set to a predetermined second temperature (first heating temperature) (which is higher than the first temperature, e.g., about 160° C.). The sulfuric acid-containing liquid is circulated through the second circulation tank 51 and the second circulation pipes 53 (the common pipe 51A and the sulfuric acid-containing liquid flowing pipes 51B), whereby the sulfuric acid-containing liquid is conditioned at the second temperature from the previous first temperature.

The second liquid storage 12 includes the same number of sulfuric acid-containing liquid supply pipes 57 as the number of the treatment units 6 included in each of the towers, and the sulfuric acid-containing liquid supply pipes 57 are branched from the second circulation pipe 53 and adapted to supply the sulfuric acid-containing liquid to the plural treatment units 6 (three treatment units 6) of the corresponding tower.

The heaters (third heater) 54 are respectively provided in the sulfuric acid-containing liquid supply pipes 57. A flow rate meter 58, a sulfuric acid-containing liquid flow rate control valve (mixing ratio changing unit) 59, and a sulfuric acid-containing liquid valve 60 are provided in this order from the side of the heater 54 downstream of the heater 54 in each of the sulfuric acid-containing liquid supply pipes 57.

The flow rate meter 58 is a flow rate meter which detects the flow rate of the sulfuric acid-containing liquid flowing through the sulfuric acid-containing liquid supply pipe 57.

The sulfuric acid-containing liquid flow rate control valve 59 is a valve which adjusts the opening degree of the sulfuric acid-containing liquid supply pipe 57 to control the flow rate of the sulfuric acid-containing liquid to be supplied to the SPM nozzle 13. The sulfuric acid-containing liquid flow rate control valve 59 may be configured to include a valve body having a valve seat therein, a valve element which opens and closes the valve seat, and an actuator which moves the valve element between an open position and a closed position.

The sulfuric acid-containing liquid valve 60 is a valve which controls the on and off of the supply of the sulfuric acid-containing liquid to the SPM nozzle 13.

A return pipe 61 is branched from the sulfuric acid-containing liquid supply pipe 57 at a position between the sulfuric acid-containing liquid valve 60 and the sulfuric acid-containing liquid flow rate control valve 59. A downstream end of the return pipe 61 is connected to the sulfuric acid-containing liquid flowing pipe 51B. A pressure loss in a portion of the sulfuric acid-containing liquid supply pipe 57 upstream of the branch position 63 is greater than a pressure loss in the return pipe 61.

When the sulfuric acid-containing liquid is to be supplied to the SPM nozzle 13, the control device 4 opens the sulfuric acid-containing liquid valve 60. Thus, the pressure loss in the return pipe 61 increases to a level greater than the pressure loss in the portion of the sulfuric acid-containing liquid supply pipe 57 downstream of the branch position 63. Therefore, the sulfuric acid-containing liquid in the portion of the sulfuric acid-containing liquid supply pipe 57 upstream of the branch position 63 is supplied to the portion of the sulfuric acid-containing liquid supply pipe 57 downstream of the branch position 63, and supplied from the downstream portion to the SPM nozzle 13.

When the supply of the sulfuric acid-containing liquid to the SPM nozzle 13 is to be stopped, the control device 4 closes the sulfuric acid-containing liquid valve 60. Thus, the pressure loss in the return pipe 61 decreases to a level smaller than the pressure loss in the portion of the sulfuric acid-containing liquid supply pipe 57 downstream of the branch position 63. Therefore, the sulfuric acid-containing liquid reaching the branch position 63 does not flow back to the portion of the sulfuric acid-containing liquid supply pipe 57 upstream of the branch position 63, but is guided to the return pipe 61. The sulfuric acid-containing liquid guided to the return pipe 61 flows back to the sulfuric acid-containing liquid flowing pipe 51B, and is circulated again through the second circulation tank 51 and the second circulation pipe 53 (the common pipe 51A and the sulfuric acid-containing liquid flowing pipe 51B).

The heater 54 heats the sulfuric acid-containing liquid flowing through the sulfuric acid-containing liquid supply pipe 57. The heating temperature of the heater 54 is set to a predetermined third temperature (which is higher than the second temperature, e.g., about 165° C.). The sulfuric acid-containing liquid flows through the sulfuric acid-containing liquid supply pipe 57, whereby the temperature of the sulfuric acid-containing liquid conditioned at the second temperature is increased to the third temperature from the previous second temperature.

During the operation of the substrate processing apparatus 1 (including the period in which the treatment of the substrates W is halted), the fourth liquid pumping device 56 and the second circulation heater 52 are constantly driven. During the operation of the substrate processing apparatus 1, therefore, the sulfuric acid-containing liquid conditioned at the second temperature is circulated through the second circulation tank 51 and the second circulation pipe 53 (the common pipe 51A and the sulfuric acid-containing liquid flowing pipe 51B).

With the sulfuric acid-containing liquid valves 60 closed, the sulfuric acid-containing liquid flowing through the second circulation pipe 53 flows from the second circulation pipe 53 to the sulfuric acid-containing liquid supply pipes 57, and further flows into the return pipes 61 through the branch positions 63 and then back to the sulfuric acid-containing liquid flowing pipe 51B. Thus, the sulfuric acid-containing liquid is circulated through the second circulation tank 51 and the second circulation pipe 53.

With the sulfuric acid-containing liquid valves 60 open, on the other hand, the sulfuric acid-containing liquid flowing through the sulfuric acid-containing liquid flowing pipe 51B flows from the second circulation pipe 53 to the sulfuric acid-containing liquid supply pipes 57 to be supplied to the SPM nozzles 13. That is, the sulfuric acid-containing liquid conditioned at the third temperature is supplied to the SPM nozzles 13.

With reference to the output of the liquid amount meter 65, the amount of the sulfuric acid-containing liquid stored in the second circulation tank 51 is constantly monitored by the control device 4. When the amount of the sulfuric acid-containing liquid stored in the second circulation tank 51 is reduced below a lower limit liquid amount, the on/off valve 38 is opened to supply the sulfuric acid-containing liquid from the first liquid storage 11 through the first liquid guide pipe 31.

In one of the three sulfuric acid-containing liquid flowing pipes 51B, a sulfuric acid concentration meter 64 which measures the sulfuric acid concentration of the sulfuric acid-containing liquid flowing through the sulfuric acid-containing liquid flowing pipe 51B (i.e., the sulfuric acid-containing liquid circulated through the second circulation tank 51 and the second circulation pipe 53) is provided downstream of the fourth liquid pumping device 56. Since it is considered that the sulfuric acid-containing liquid flowing through the three second circulation pipes 53 has the same sulfuric acid concentration, it is sufficient to provide the single sulfuric acid concentration meter 64 in one of the three second circulation pipes 53.

With reference to the output of the sulfuric acid concentration meter 64, the sulfuric acid concentration of the sulfuric acid-containing liquid circulated through the second circulation tank 51 and the second circulation pipes (the sulfuric acid concentration of the sulfuric acid-containing liquid stored in the second circulation tank 51) is constantly monitored by the control device 4. When the sulfuric acid concentration of the sulfuric acid-containing liquid circulated through the second circulation tank 51 and the second circulation pipes 53 is reduced below a lower limit concentration, the sulfuric acid addition valve 45 which opens and closes the sulfuric acid addition pipe 44 is opened to supply sulfuric acid to the first circulation tank 22 (sulfuric acid adding step). Thus, the sulfuric acid concentration of the sulfuric acid-containing liquid circulated through the first circulation tank 22 and the first circulation pipe 23 is increased and, after a while, the sulfuric acid concentration of the sulfuric acid-containing liquid circulated through the second circulation tank 51 and the second circulation pipes 53 is correspondingly increased.

The second liquid storage 12 has thus been described. The sulfuric acid-containing liquid supplied from the first liquid storage 11 is stored in the second circulation tank 51 of the second liquid storage 12. The sulfuric acid-containing liquid stored in the second circulation tank 51 is heated. Thus, the temperature of the sulfuric acid-containing liquid in the second liquid storage 12 can be increased to a temperature suitable for the treatment. Therefore, the second liquid storage 12 may be regarded as a storage adapted for the temperature adjustment of the sulfuric acid-containing liquid.

Figure 5:
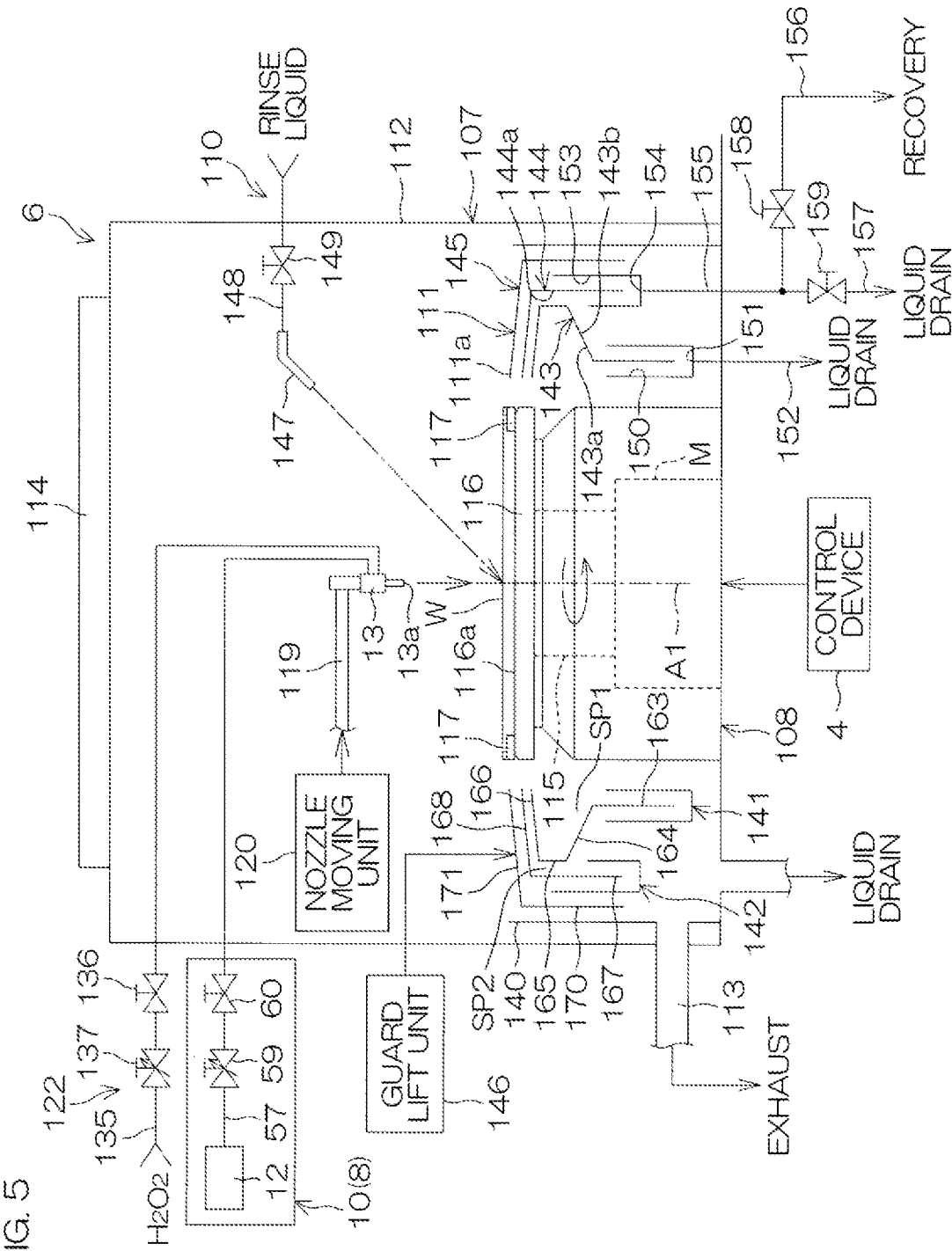
FIG. 5 is a schematic sectional view for describing the structure of a treatment unit shown in FIG. 1 by way of example.

FIG. 5 is a schematic sectional view for describing the structure of the treatment unit 6 by way of example.

The treatment units 6 each include a box-shaped chamber 107 having an inside space, a spin chuck (substrate holding unit) 108 which horizontally holds a single substrate W and rotates the substrate W about a vertical rotation axis A1 extending through the center of the substrate W in the chamber 107, the SPM nozzle 13, a rinse liquid supply unit 110 which supplies a rinse liquid to an upper surface of the substrate W held by the spin chuck 108, and a tubular treatment cup 111 surrounding the spin chuck 108.

The chamber 107 includes a box-shaped partition wall 112, a FFU (fan filter unit) 114 as an air supply unit which supplies clean air to the inside of the partition wall 112 (into the chamber 107) from an upper portion of the partition wall 112, and an exhaust device (not shown) which expels gas from the chamber 107 through a lower portion of the partition wall 112. The FFU 114 is disposed above the partition wall 112, and attached to a ceiling of the partition wall 112. The FFU 114 supplies clean air into the chamber 107 from the ceiling of the partition wall 112. The exhaust device (not shown) is connected to a bottom portion of the treatment cup 111 through an exhaust duct 113 connected to the treatment cup 111, and sucks gas from the inside of the treatment cup 111 through the bottom portion of the treatment cup 111. A down flow (downward stream) is formed in the chamber 107 by the FFU 114 and the exhaust device (not shown).

A chuck of clamp type which horizontally clamps the substrate W to horizontally hold the substrate W is used as the spin chuck 108. Specifically, the spin chuck 108 includes a spin motor (rotation unit) M, a spin shaft 115 unitary with the driving shaft of the spin motor M, and a disk-shaped spin base 116 generally horizontally attached to an upper end of the spin shaft 115.

The spin base 116 has a horizontal round upper surface 116a having an outer diameter that is greater than the outer diameter of the substrate W. A plurality of clamp members 117 (not less than three clamp members 117, e.g., six clamp members 117) are disposed on a peripheral portion of the upper surface 116a. The plural clamp members 117 are spaced a proper distance from each other circumferentially of the substrate W on the upper surface peripheral portion of the spin base 116.

The SPM nozzle 13 is, for example, a straight nozzle which spouts the SPM in the form of continuous stream. The SPM nozzle 13 is attached to a distal end of a nozzle arm 119. The SPM nozzle 13 is, for example, attached to the nozzle arm 119 in a vertical posture for spouting the treatment liquid (SPM) perpendicularly to the upper surface of the substrate W. The nozzle arm 119 extends horizontally. A nozzle moving unit 120 which moves the nozzle arm 119 to move the SPM nozzle 13 is connected to the nozzle arm 119. The nozzle moving unit 120 includes an electric motor.

The nozzle moving unit 120 horizontally moves the nozzle arm 119 about a vertical pivot axis defined adjacent to the treatment cup 111 to horizontally move the SPM nozzle 13. The nozzle moving unit 120 horizontally moves the SPM nozzle 13 between a treatment position defined such that the SPM spouted from the SPM nozzle 13 is applied to the upper surface of the substrate W and a retracted position defined such that the SPM nozzle 13 is located outside the spin chuck 108 as seen in plan. In this embodiment, the treatment position is, for example, a center position defined such that the SPM spouted from the SPM nozzle 13 is applied to an upper surface center portion of the substrate W.

The treatment liquid supply device includes a hydrogen peroxide water supply unit 122 which supplies hydrogen peroxide water ($H_2O_2$) to the SPM nozzle 13. The hydrogen peroxide water supply unit 122 includes a hydrogen peroxide water pipe 135 connected to the SPM nozzle 13, a hydrogen peroxide water valve 136 which opens and closes the hydrogen peroxide water pipe 135, and a hydrogen peroxide water flow rate control valve (mixing ratio changing unit) 137 which controls the opening degree of the hydrogen peroxide water valve 136 to control the flow rate of hydrogen peroxide water flowing through the hydrogen peroxide water valve 136. The hydrogen peroxide water flow rate control valve 137 may be configured to include a valve body having a valve seat therein, a valve element which opens and closes the valve seat, and an actuator which moves the valve element between an open position and a closed position. Hydrogen peroxide water, which is temperature-uncontrolled and has an ordinary temperature (about 20° C. to about 40° C.), is supplied from a hydrogen peroxide water supply source (not shown) to the hydrogen peroxide water pipe 135.

With the sulfuric acid-containing liquid valve 60 and the hydrogen peroxide water valve 136 open, the sulfuric acid-containing liquid supplied at a higher temperature (165° C.) through the sulfuric acid-containing liquid supply pipe 57 and hydrogen peroxide water supplied through the hydrogen peroxide water pipe 135 are supplied into a casing (not shown) of the SPM nozzle 13, and sufficiently mixed (stirred) together in the casing. Thus, the sulfuric acid-containing liquid and hydrogen peroxide water are homogeneously mixed together, whereby a liquid mixture (SPM) of sulfuric acid and hydrogen peroxide water is prepared by a reaction between sulfuric acid contained in the sulfuric acid-containing liquid and hydrogen peroxide water. The SPM contains peroxosulfuric acid (peroxomonosulfuric acid, $H_2SO_5$) having a higher oxidation power, and is heated to a temperature (e.g., about 190° C. to about 220° C.) that is higher than the temperature of the sulfuric acid-containing liquid (e.g., about 165° C.) and the temperature of hydrogen peroxide water before the mixing. The prepared higher-temperature SPM is spouted from the spout that opens at a distal end (e.g., lower end) of the casing of the SPM nozzle 13.

The flow rate of the sulfuric acid-containing liquid to be supplied to the SPM nozzle 13 is changed by the sulfuric acid-containing liquid flow rate control valve 59. The flow rate of hydrogen peroxide water to be supplied to the SPM nozzle 13 is changed by the hydrogen peroxide water flow rate control valve 137. Therefore, the mixing ratio between the sulfuric acid-containing liquid and hydrogen peroxide water is changed by the sulfuric acid-containing liquid flow rate control valve 59 and the hydrogen peroxide water flow rate control valve 137. The mixing ratio between the sulfuric acid-containing liquid and hydrogen peroxide water (the flow rate ratio between the sulfuric acid-containing liquid and hydrogen peroxide water) is controlled, for example, within a range of 30:1 ((sulfuric acid-containing liquid):(hydrogen peroxide water)) to 2:1 ((sulfuric acid-containing liquid):(hydrogen peroxide water)).

The rinse liquid supply unit 110 includes a rinse liquid nozzle 147 which spouts a rinse liquid toward the upper surface of the substrate W. The rinse liquid nozzle 147 is, for example, a straight nozzle which spouts the liquid in the form of continuous stream. The rinse liquid nozzle 147 is a stationary nozzle fixed to the partition wall 112 of the chamber 107. The spout of the rinse liquid nozzle 147 is directed toward the upper surface center portion of the substrate W. The rinse liquid nozzle 147 may be a scan nozzle which is movable within the chamber 107. That is, the rinse liquid supply unit 110 may include a nozzle moving unit which moves the rinse liquid nozzle 147 so that a rinse liquid application position with respect to the upper surface of the substrate W is moved within the upper surface of the substrate W.

The rinse liquid nozzle 147 is connected to a rinse liquid pipe 148 which guides the rinse liquid from a rinse liquid supply source. A rinse liquid valve 149 for switching the on and off of the supply of the rinse liquid from the rinse liquid nozzle 147 is provided in the rinse liquid pipe 148. With the rinse liquid valve 149 open, the rinse liquid is supplied from the rinse liquid pipe 148 to the rinse liquid nozzle 147 to be spouted from a spout provided at a lower end of the rinse liquid nozzle 147.

With the rinse liquid valve 149 closed, the supply of the rinse liquid from the rinse liquid pipe 148 to the rinse liquid nozzle 147 is stopped. The rinse liquid is, for example, deionized water (DIW), but not limited to the DIW. The rinse liquid may be carbonated water, electrolytic ion water, hydrogen water, ozone water, ammonia water, and hydrochloric acid water having a dilute concentration (e.g., about 10 ppm to about 100 ppm). The rinse liquid may be at an ordinary temperature (20° C. to 40° C.), or may be heated before being supplied to the substrate W.

The treatment cup 111 is disposed outward of the substrate W held by the spin chuck 108 (apart from the rotation axis A1). The treatment cup 111 laterally surrounds the spin base 116. When the treatment liquid is supplied to the substrate W being rotated by the spin chuck 108, the treatment liquid supplied to the substrate W is spun out around the substrate W. When the treatment liquid is supplied to the substrate W, an upper edge 111a of the treatment cup 111 which opens upward is located at a higher level than the spin base 116. Therefore, the treatment liquid such as the chemical liquid and water is expelled around the substrate W to be received by the treatment cup 111. Then, the treatment liquid received by the treatment cup 111 is supplied to the reclaim tank 21 of the first liquid storage 11, or is supplied to the waste liquid disposal device (not shown) via the cooling unit (not shown).

The treatment cup 111 includes a plurality of tubular guards (a first guard 143, a second guard 144, and a third guard 145) which receive the treatment liquid (the chemical liquid or the rinse liquid) scattered around the substrate W, and a plurality of annular cups (a first cup 141 and a second cup 142) which receive the treatment liquid guided by the plurality of guards, and a hollow cylindrical member 140 which surrounds the plurality of guards and the plurality of cups.

The treatment cup 111 further includes a guard lift unit 146 which independently moves up and down the respective guards (the first guard 143, the second guard 144, and the third guard 145). The guard lift unit 146 includes, for example, an electric motor which generates power, a ball screw mechanism which transmits the power of the electric motor to any of the guards. When the guard lift unit 146 moves up and down at least one of the three guards, the state of the treatment cup 111 is changed.

As will be described later, the state of the treatment cup 111 is switched among a retracted state in which the upper edges of all the guards are located at a lower level than the substrate W (as shown in FIG. 5), a first opposed state in which the first guard 143 is opposed to the peripheral surface of the substrate W, a second opposed state in which the second guard 144 is opposed to the peripheral surface of the substrate W, and a third opposed state in which the third guard 145 is opposed to the peripheral surface of the substrate W.

The first cup 141 surrounds the spin chuck 108 inside the hollow cylindrical member 140. The first cup 141 defines an annular first channel 150 into which the treatment liquid used for the treatment of the substrate W flows. A liquid drain port 151 is provided in the lowermost portion of the bottom of the first channel 150, and a first liquid drain pipe 152 is connected to the liquid drain port 151. The treatment liquid introduced into the first liquid drain pipe 152 is supplied to a liquid drain device, and treated in the liquid drain device.

The second cup 142 surrounds the first cup 141 inside the hollow cylindrical member 140. The second cup 142 defines an annular second channel 153 into which the treatment liquid used for the treatment of the substrate W flows. A liquid drain/recovery port 154 is provided in the lowermost portion of the bottom of the second channel 153, and a common pipe 155 is connected to the liquid drain/recovery port 154. The recovery pipe 156 and a second liquid drain pipe 157 are branched from the common pipe 155. An upstream end of the recovery pipe 156 is connected to the common pipe 155, and a downstream end of the recovery pipe 156 is connected to the reclaim tank 21 of the first liquid storage 11.

A recovery valve 158 is provided in the recovery pipe 156, and a liquid drain valve 159 is provided in the second liquid drain pipe 157. With the liquid drain valve 159 closed and with the recovery valve 158 open, the liquid flowing through the common pipe 155 is guided to the recovery pipe 156. With the liquid drain valve 159 open and with the recovery valve 158 closed, the liquid flowing through the common pipe 155 is guided to the second liquid drain pipe 157. The recovery valve 158 and the liquid drain valve 159 are included in a recovery/drain switching unit which switches, between the recovery pipe 156 and the second liquid drain pipe 157, the pipe into which the liquid expelled from the substrate W flows.

The innermost first guard 143 surrounds the spin chuck 108 inside the hollow cylindrical member 140. The first guard 143 includes a hollow cylindrical lower portion 163 which surrounds the periphery of the spin chuck 108, a tubular portion 164 extending outward from an upper edge of the lower portion 163 (apart from the rotation axis A1 of the substrate W), a hollow cylindrical middle portion 165 extending vertically upward from an upper edge of the tubular portion 164, and an annular upper portion 166 extending obliquely upward inward from an upper edge of the middle portion 165 (toward the rotation axis A1 of the substrate W).

The lower portion 163 of the first guard 143 is located above the first channel 150 of the first cup 141. An inner peripheral edge of the upper portion 166 of the first guard 143 has a round shape having a greater diameter than the substrate W held by the spin chuck 108 as seen in plan. As shown in FIG. 5, the upper portion 166 of the first guard 143 has a linear sectional shape. The sectional shape of the upper portion 166 may be a nonlinear shape such as an arcuate shape.

The second guard 144 located at the second position from the inner side surrounds the first guard 143 inside the hollow cylindrical member 140. The second guard 144 includes a hollow cylindrical portion 167 which surrounds the first guard 143, and an annular upper portion 168 extending obliquely upward from an upper edge of the hollow cylindrical portion 167 toward the center thereof (toward the rotation axis A1 of the substrate W). The hollow cylindrical portion 167 of the second guard 144 is located above the second channel 153 of the second cup 142.

An inner peripheral edge of the upper portion 168 of the second guard 144 has a round shape having a greater diameter than the substrate W held by the spin chuck 108 as seen in plan. The upper portion 168 of the second guard 144 has a linear sectional shape. The sectional shape of the upper portion 168 may be a nonlinear shape such as an arcuate shape. The upper portion 168 of the second guard 144 vertically overlaps with the upper portion 166 of the first guard 143. The upper portion 168 of the second guard 144 is configured so as to be spaced a minute distance from the upper portion 166 of the first guard 143 when the first guard 143 and the second guard 144 are located closest to each other.

The third guard 145 located at the third position from the inner side surrounds the second guard 144 inside the hollow cylindrical member 140. The third guard 145 includes a hollow cylindrical portion 170 which surrounds the second guard 144, and an annular upper portion 171 extending obliquely upward from an upper edge of the hollow cylindrical portion 170 toward the center thereof (toward the rotation axis A1 of the substrate W). An inner peripheral edge of the upper portion 171 has a round shape having a greater diameter than the substrate W held by the spin chuck 108 as seen in plan. The upper portion 171 has a linear sectional shape. The sectional shape of the upper portion 171 may be a nonlinear shape such as an arcuate shape.

The first channel 150 of the first cup 141, an inner wall 143a of the first guard 143, and the casing outer periphery of the spin chuck 108 define a first flow space (i.e., liquid drain space) SP1 into which the chemical liquid used for the treatment of the substrate W is guided. The second channel 153 of the second cup 142, an outer wall 143b of the first guard 143, and an inner wall 144a of the second guard 144 define a second flow space (i.e., recovery space) SP2 into which the chemical liquid used for the treatment of the substrate W is guided. The first flow space SP1 and the second flow space SP2 are separated from each other by the first guard 143.

The guard lift unit 146 moves up and down each of the guards (the first guard 143, the second guard 144, and the third guard 145) between an upper position defined such that the upper edge of the guard is located at a higher level than the substrate W and a lower position defined such that the upper edge of the guard is located at a lower level than the substrate W. The guard lift unit 146 is capable of holding each of the guards at any position between the upper position and the lower position. The treatment liquid is supplied to the substrate W with any of the guards in opposed relation to the peripheral surface of the substrate W.

Where the treatment cup 111 is in the first opposed state in which the innermost first guard 143 is opposed to the peripheral surface of the substrate W, the first guard 143, the second guard 144, and the third guard 145 are all located at the upper position (treatment height position). Where the treatment cup 111 is in the second opposed state in which the second guard 144 located at the second position from the inner side is opposed to the peripheral surface of the substrate W, the second and third guards 144, 145 are each located at the upper position, and the first guard 143 is located at the lower position. Where the treatment cup 111 is in the third opposed state in which the outermost third guard 145 is opposed to the peripheral surface of the substrate W, the third guard 145 is located at the upper position, and the first guard 143 and the second guard 144 are each located at the lower position. In the retracted state (see FIG. 5) in which all the guards are retracted from the peripheral surface of the substrate W, the first guard 143, the second guard 144, and the third guard 145 are all located at the lower position.

As will be described later, when the treatment cup 111 is switched from the first opposed state to the second opposed state, the first guard 143 is located at a cleaning height position between the upper position and the lower position with the second guard 144 and the third guard 145 each located at the upper position. This state is a transition state in which the treatment cup 111 is switched from the first opposed state to the second opposed state. The treatment cup 111 is switched to any of the plural states including the first to third opposed states, the retracted state, and the transition state. The transition state is such that the first guard 143 is opposed to the peripheral surface of the substrate W.

Figure 6:
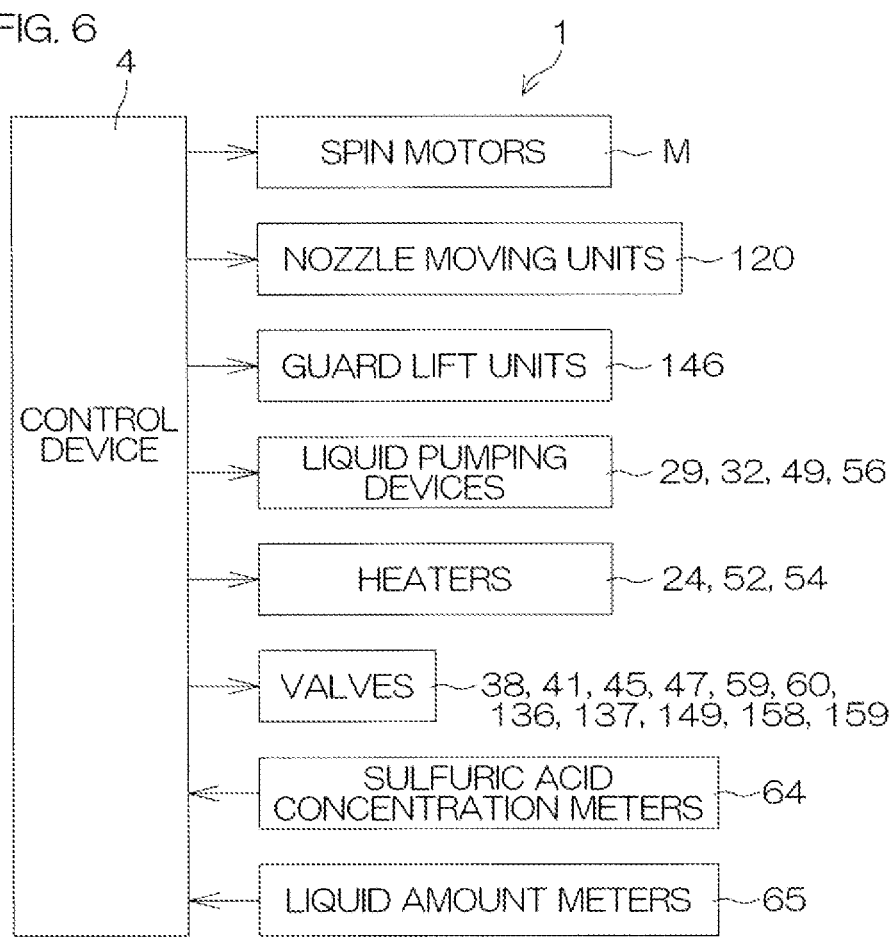
FIG. 6 is a block diagram for describing the electrical configuration of the substrate processing apparatus.

FIG. 6 is a block diagram for describing the electrical configuration of the substrate processing apparatus 1.

The control device 4 is, for example, a computer. The control device 4 includes an arithmetic unit such as CPU, storage units such as a fixed memory device and a hard disk drive, and an input/output unit for inputting and outputting information. The storage units include computer-readable recording media which store computer programs to be executed by the arithmetic unit. Process steps to be executed by the control device 4 for the resist removal treatment to be described later are incorporated in the storage media.

The control device 4 controls the operations of the spin motors M, the nozzle moving units 120, the guard lift units 146, the first liquid pumping devices 29, the second liquid pumping devices 32, the third liquid pumping devices 49, the fourth liquid pumping devices 56, the first circulation heaters 24, the second circulation heaters 52, the heaters 54, and the like according to a predetermined program. Further, the control device 4 controls the on/off operations of the on/off valves 38, the return valves 41, the sulfuric acid addition valves 45, the liquid drain valves 47, the sulfuric acid-containing liquid valves 60, the hydrogen peroxide water valves 136, the rinse liquid valves 149, the recovery valves 158, the liquid drain valves 159, and the like according to a predetermined program. The control device 4 controls the opening degrees of the sulfuric acid-containing liquid flow rate control valves 59, and the hydrogen peroxide water flow rate control valves 137 according to a predetermined program. The measurement values of the sulfuric acid concentration meters 64 and the liquid amount meters 65 are inputted to the control device 4.

Figure 7:
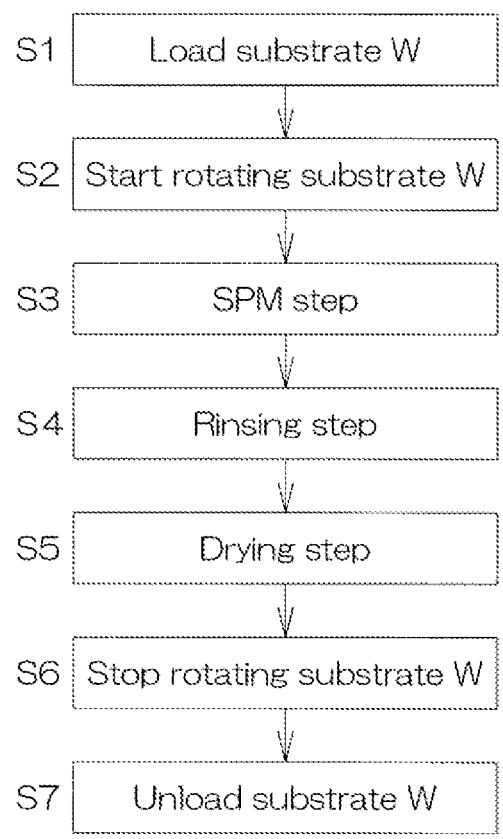
FIG. 7 is a flowchart for describing an exemplary substrate processing process to be performed by the substrate processing apparatus.

FIG. 7 is a flowchart for describing an exemplary treatment to be performed on the substrate W by the substrate processing apparatus 1.

With reference to FIGS. 1 to 7, the treatment of the substrate W will hereinafter be described by way of example. The exemplary treatment of the substrate W is a resist removal treatment for removing a resist from the upper surface (major surface) of the substrate W. The resist is, for example, a photoresist of a carbon-containing compound.

When a substrate W with its front surface (device formation surface) at least partly covered with the resist is to be treated by the substrate processing apparatus 1, the control device 4 retracts all the nozzles from above the spin chuck 108 and locates all the guards 143 to 145 at the lower position and, in this state, inserts the hand of the substrate transport robot (the first substrate transport robot CR1 or the second substrate transport robot CR2 (see FIG. 1) into the chamber 107 with the substrate W held thereon. Thus, the substrate W is transferred to the spin chuck 108 and held by the spin chuck 108 with its front surface facing up.

With the substrate W held by the spin chuck 108, the control device 4 starts rotating the spin motor M. Thus, the rotation of the substrate W is started (S2 in FIG. 7). The rotation speed of the substrate W is increased to a predetermined liquid treatment speed (within a range of 300 to 1500 rpm, e.g., 500 rpm), and kept at the liquid treatment speed. After the rotation speed of the substrate W reaches the liquid treatment speed, the control device 4 performs an SPM step S3.

Specifically, the control device 4 controls the nozzle moving unit 120 to move the SPM nozzle 13 from the retracted position to the treatment position. Further, the control device 4 opens the sulfuric acid-containing liquid valve 60 and the hydrogen peroxide water valve 136 simultaneously. Thus, the sulfuric acid-containing liquid flowing through the sulfuric acid-containing liquid supply pipe 57 is supplied to the SPM nozzle 13 and, at the same time, hydrogen peroxide water flowing through the hydrogen peroxide water pipe 135 is supplied to the SPM nozzle 13. Inside the SPM nozzle 13, the sulfuric acid-containing liquid and hydrogen peroxide water are mixed together, whereby the SPM is prepared at a higher temperature (e.g., 190° C. to 220° C.). The SPM is spouted from the spout of the SPM nozzle 13 to be applied to the upper surface center portion of the substrate W.

After the SPM spouted from the SPM nozzle 13 is applied to the upper surface of the substrate W, the SPM flows outward on the upper surface of the substrate W by centrifugal force. Therefore, the SPM is supplied over the entire upper surface of the substrate W, whereby a liquid film of the SPM is formed on the substrate W as covering the entire upper surface of the substrate W. Thus, the resist chemically reacts with the SPM to be thereby removed from the substrate W by the SPM. The SPM is moved to the periphery of the substrate W to be scattered laterally of the substrate W from the periphery of the substrate W.

In the SPM step S3, the control device 4 may control the nozzle moving unit 120 to move the SPM nozzle 13 between a peripheral position at which the SPM nozzle 13 is opposed to an upper surface peripheral portion of the substrate W and a center position at which the SPM nozzle 13 is opposed to the upper surface center portion of the substrate W. In this case, the SPM application position on the upper surface of the substrate W is moved over the entire upper surface of the substrate W, whereby the entire upper surface of the substrate W is scanned with the SPM application position. Thus, the entire upper surface of the substrate W is evenly treated.

After a lapse of a predetermined period from the start of the spouting of the SPM, the control device 4 closes the sulfuric acid-containing liquid valve 60 and the hydrogen peroxide water valve 136 to stop spouting the SPM from the SPM nozzle 13. Thus, the SPM step S3 ends. Thereafter, the control device 4 controls the nozzle moving unit 120 (see FIG. 6) to move the SPM nozzle 13 back to the retracted position.

Then, a rinsing step of supplying the rinse liquid to the substrate W (S4 in FIG. 7) is performed. Specifically, the control device 4 opens the rinse liquid valve 149 to spout the rinse liquid from the rinse liquid nozzle 147 toward the upper surface center portion of the substrate W. The rinse liquid spouted from the rinse liquid nozzle 147 is applied to the upper surface center portion of the substrate W covered with the SPM. The rinse liquid applied to the upper surface center portion of the substrate W receives centrifugal force generated by the rotation of the substrate W to flow toward the periphery of the substrate W on the upper surface of the substrate W. Thus, the SPM on the substrate W is forced to flow outward to be expelled around the substrate W by the rinse liquid. As a result, the SPM and the resist (residual resist) are washed away from the entire upper surface of the substrate W. After a lapse of a predetermined period from the start of the rinsing step S4, the control device 4 closes the rinse liquid valve 149 to stop spouting the rinse liquid from the rinse liquid nozzle 147.

Then, a drying step of drying the substrate W (S5 in FIG. 7) is performed. Specifically, the control device 4 controls the spin motor M to accelerate the substrate W to a drying rotation speed (e.g., several thousands rpm) that is higher than the rotation speed employed in the SPM step S3 and the rinsing step S4 and rotate the substrate W at the drying rotation speed. Thus, greater centrifugal force is applied to the liquid adhering to the substrate W to spin out the liquid around the substrate W. In this manner, the liquid is removed from the substrate W, whereby the substrate W is dried. After a lapse of a predetermined period from the start of the high-speed rotation of the substrate W, the control device 4 stops the spin motor M to stop the rotation of the substrate W by the spin chuck 108 (S6 in FIG. 7).

Then, the substrate W is unloaded from the chamber 107 (S7 in FIG. 7). Specifically, the control device 4 inserts the hand of the substrate transport robot (the first substrate transport robot CR1 or the second substrate transport robot CR2 (see FIG. 1)) into the chamber 107 with all the guards 143 to 145 located at the lower position. Then, the control device 4 causes the hand of the substrate transport robot to hold the substrate W held on the spin chuck 108. Thereafter, the control device 4 retracts the hand of the substrate transport robot from the chamber 107. Thus, the substrate W with its front surface (device formation surface) removed of the resist is unloaded from the chamber 107.

Next, the change in the mixing ratio between the sulfuric acid-containing liquid and hydrogen peroxide water in the SPM step (S3 in FIG. 7), the operations of the first guard 143 and the second guard 144, and the like will be described.

Figure 8:
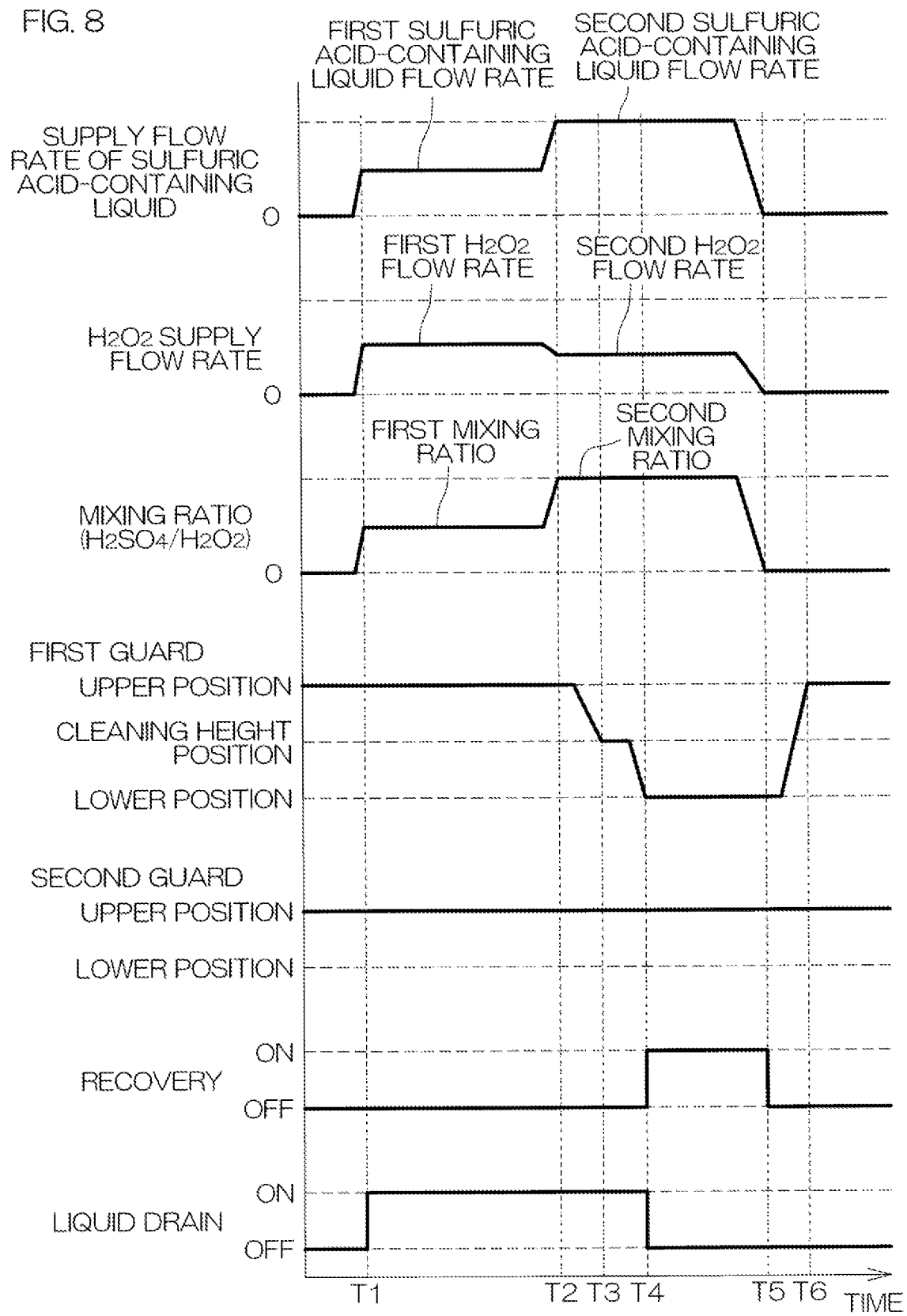
FIG. 8 is a timing chart showing a change in the mixing ratio between the sulfuric acid-containing liquid and hydrogen peroxide water, the operations of a first guard and a second guard, and the like in an SPM step (S3 in FIG. 7).

FIG. 8 is a timing chart showing the change in the mixing ratio between the sulfuric acid-containing liquid and hydrogen peroxide water, the operations of the first guard 143 and the second guard 144, and the like in the SPM step (S3 in FIG. 7). In FIG. 8, "RECOVERY ON" means that the SPM expelled from the substrate W flows into the recovery pipe 156 through the second guard 144, and "RECOVERY OFF" means that the flow of the SPM into the recovery pipe 156 is stopped. In FIG. 8, "LIQUID DRAIN ON" means that the SPM expelled from the substrate W flows into the first liquid drain pipe 152 through the first guard 143, and "LIQUID DRAIN OFF" means that the flow of the SPM into the first liquid drain pipe 152 is stopped. In the following description, reference will be made to FIGS. 5 and 8. The control device 4 controls the substrate processing apparatus 1 to perform the following process. In other words, the control device 4 is programmed so as to perform the following process.

When the sulfuric acid-containing liquid valve 60 and the hydrogen peroxide water valve 136 are opened at time T1 in FIG. 8, the sulfuric acid-containing liquid is supplied at a first sulfuric acid-containing liquid flow rate to the SPM nozzle 13, and hydrogen peroxide water is supplied at a first $H_2O_2$ flow rate to the SPM nozzle 13. Therefore, the sulfuric acid-containing liquid and hydrogen peroxide water are mixed in a first mixing ratio ((first sulfuric acid-containing liquid flow rate)/(first $H_2O_2$ flow rate) within the SPM nozzle 13. Thus, a first SPM is prepared within the SPM nozzle 13, and spouted from the SPM nozzle 13 toward the upper surface of the substrate W (first SPM supplying step). As a result, a film of the first SPM is formed, which covers the entire upper surface of the substrate W.

After a lapse of a predetermined period from the opening of the sulfuric acid-containing liquid valve 60 and the hydrogen peroxide water valve 136, at least one of the opening degree of the sulfuric acid-containing liquid flow rate control valve 59 and the opening degree of the hydrogen peroxide water flow rate control valve 137 is changed at time T2 shown in FIG. 8, and the sulfuric acid-containing liquid and hydrogen peroxide water are mixed in a second mixing ratio ((second sulfuric acid-containing liquid flow rate)/ (second $H_2O_2$ flow rate)) that is greater than the first mixing ratio within the SPM nozzle 13. In FIG. 8, both the opening degree of the sulfuric acid-containing liquid flow rate control valve 59 and the opening degree of the hydrogen peroxide water flow rate control valve 137 are changed by way of example. Thus, a second SPM is prepared within the SPM nozzle 13, and spouted from the SPM nozzle 13 toward the upper surface of the substrate W (second SPM supplying step). As a result, the first SPM film covering the entire upper surface of the substrate W is replaced with a film of the second SPM which covers the entire upper surface of the substrate W.

In the example shown in FIG. 8, the sulfuric acid-containing liquid is supplied at the second sulfuric acid-containing liquid flow rate greater than the first sulfuric acid-containing liquid flow rate to the SPM nozzle 13, and hydrogen peroxide water is supplied at the second $H_2O_2$ flow rate smaller than the first $H_2O_2$ flow rate to the SPM nozzle 13. The second sulfuric acid-containing liquid flow rate and the second $H_2O_2$ flow rate may be set so that the flow rate of the SPM to be spouted from the SPM nozzle 13 is kept constant even if the mixing ratio (the ratio of the sulfuric acid-containing liquid to hydrogen peroxide water) is changed, or may be set so that the flow rate of the SPM to be spouted from the SPM nozzle 13 is increased or reduced. The mixing ratio is continuously changed from the first mixing ratio to the second mixing ratio. Therefore, the SPM to be supplied to the upper surface of the substrate W is continuously changed from a state in which the hydrogen peroxide concentration is higher to a state in which the sulfuric acid-containing liquid concentration is higher.

After a lapse of a predetermined period from the time at which the mixing ratio for the SPM is changed to the second mixing ratio, the sulfuric acid-containing liquid valve 60 and the hydrogen peroxide water valve 136 are closed to stop spouting the SPM from the SPM nozzle 13 at time T5 shown in FIG. 8.

As shown in FIG. 8, the treatment cup 111 is set in the first opposed state in which the innermost first guard 143 out of the three guards 143 to 145 is opposed to the peripheral surface of the substrate W before the SPM nozzle 13 starts spouting the first SPM (before time T1 shown in FIG. 8). Therefore, the first SPM expelled from the substrate W is received by the inner wall 143a of the first guard 143 to be guided to the first cup 141 (first SPM capturing step). Then, the first SPM in the first cup 141 is drained into the first liquid drain pipe 152 ("LIQUID DRAIN ON" shown in FIG. 8, liquid draining step).

As shown in FIG. 8, when the mixing ratio for the SPM is changed to the second mixing ratio (at time T2 shown in FIG. 8), the first guard 143 is located at the upper position. Therefore, the second SPM expelled from the substrate W is received by the inner wall 143a of the first guard 143, and guided to the first cup 141. After the mixing ratio for the SPM is changed to the second mixing ratio, the guard lift unit 146 moves down the first guard 143 to the cleaning height position between the upper position and the lower position at time T3 shown in FIG. 8. Thus, an SPM hitting position at which the second SPM directly hits the inner wall 143a of the first guard 143 is moved up with respect to the first guard 143.

After the first guard 143 is maintained at the cleaning height position for a predetermined period, for example, the guard lift unit 146 moves down the first guard 143 to the lower position at time T4 shown in FIG. 8. In a state such that the second SPM is spouted from the SPM nozzle 13 and the entire upper surface of the substrate W is covered with the second SPM film, therefore, the treatment cup 111 is switched to the second opposed state such that the second guard 144 is opposed to the peripheral surface of the substrate W. The second SPM expelled from the substrate W is received by the inner wall 144a of the second guard 144, and guided to the second cup 142 (second SPM capturing step). Then, the second SPM in the second cup 142 is supplied to the reclaim tank 21 of the first liquid storage 11 through the common pipe 155 and the recovery pipe 156. Thus, the second SPM supplied to the substrate W is recovered (recovering step, "RECOVERY ON" shown in FIG. 8).

After the spouting of the SPM from the SPM nozzle 13 is stopped at time T5 shown in FIG. 8, the guard lift unit 146 moves up the first guard 143 from the lower position to the upper position at time T6 shown in FIG. 8. In a state such that the spouting of the SPM from the SPM nozzle 13 is stopped and the entire upper surface of the substrate W is covered with the SPM film, the treatment cup 111 is thus switched to the first opposed state such that the first guard 143 is opposed to the peripheral surface of the substrate W. In this state, a rinsing step of supplying the rinse liquid to the substrate W (S4 in FIG. 7) is performed. A drying step of drying the substrate W (S5 in FIG. 7) is performed with the treatment cup 111 set in the third opposed state such that the third guard 145 is opposed to the peripheral surface of the substrate W.

Figure 9:
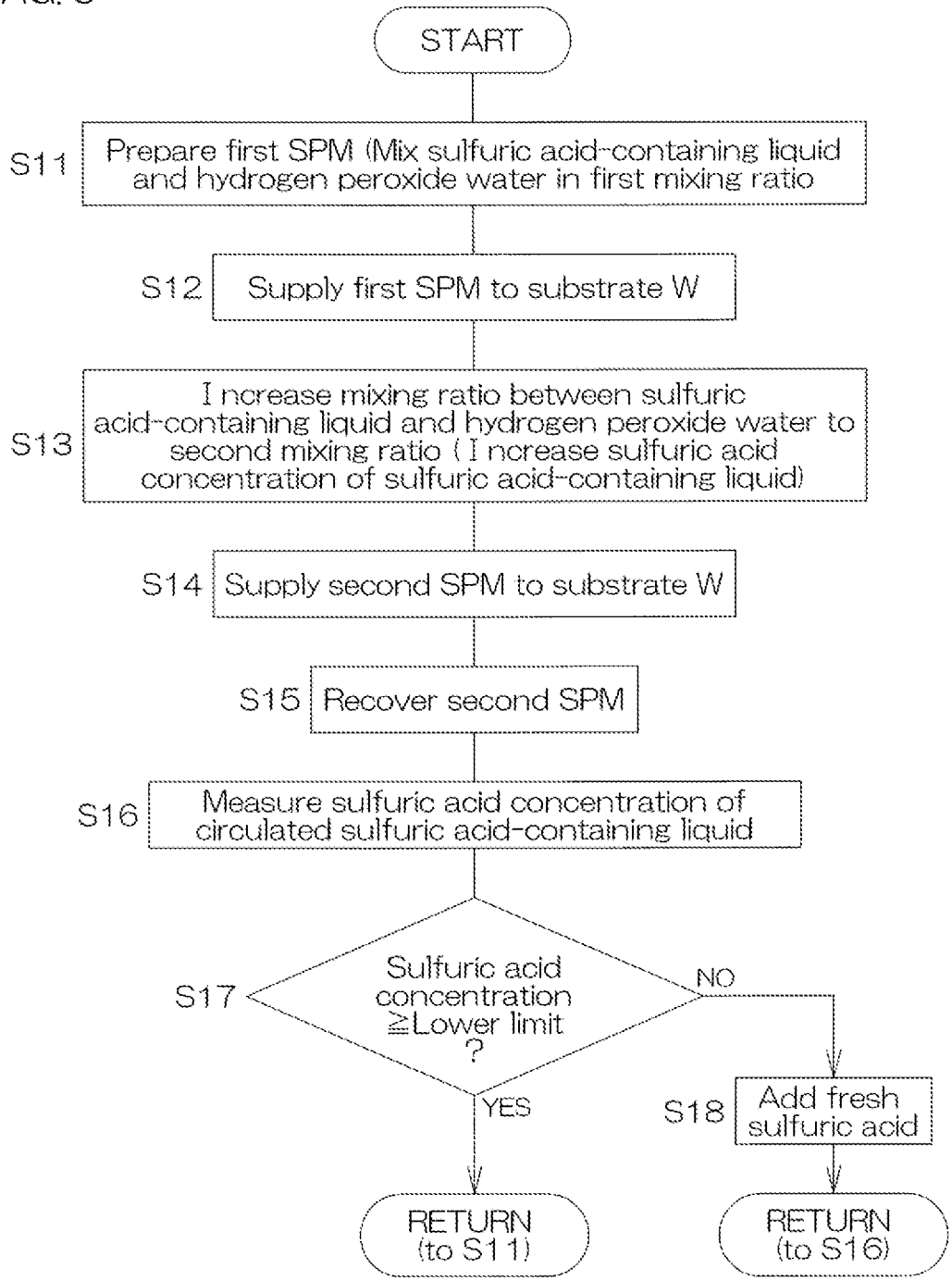
FIG. 9 is a flowchart showing a process to be performed when the sulfuric acid-containing liquid and hydrogen peroxide water are mixed together for preparation of SPM, and SPM recovered from a substrate is supplied to another substrate.

FIG. 9 is a flowchart showing a process to be performed when the sulfuric acid-containing liquid and hydrogen peroxide water are mixed together to prepare the SPM and the SPM recovered from the substrate W is supplied to another substrate W. In the following description, reference will be made to FIGS. 5 and 9. The control device 4 controls the substrate processing apparatus 1 to perform the following process. In other words, the control device 4 is programmed so as to perform the following process.

As described above, when the SPM step (S3 in FIG. 7) is started, as shown in FIG. 9, the sulfuric acid-containing liquid and hydrogen peroxide water are mixed in the first mixing ratio, whereby the first SPM is prepared (S11 in FIG. 9). The first SPM is spouted from the SPM nozzle 13 to be supplied to the substrate W (S12 in FIG. 9). Then, the first SPM expelled from the substrate W is guided to the first liquid drain pipe 152 through the first guard 143 and the first cup 141.

After a lapse of a predetermined period from the start of the spouting of the first SPM, the mixing ratio between the sulfuric acid-containing liquid and hydrogen peroxide water (the ratio of the flow rate of the sulfuric acid-containing liquid before the mixing to the flow rate of hydrogen peroxide water before the mixing) is increased from the first mixing ratio to the second mixing ratio (S13 in FIG. 9). Thus, the sulfuric acid-containing liquid and hydrogen peroxide water are mixed in the second mixing ratio, whereby the second SPM is prepared. Thereafter, the second SPM is supplied to the substrate W (S14 in FIG. 9) and expelled from the substrate W. The second SPM expelled from the substrate W is recovered as the sulfuric acid-containing liquid in the reclaim tank 21 of the first liquid storage 11 through the second guard 144, the second cup 142, the common pipe 155, and the recovery pipe 156 (S15 in FIG. 9).

The sulfuric acid-containing liquid recovered in the reclaim tank 21 is supplied to the second circulation tank 51 of the second liquid storage 12 through the first circulation tank 22 of the first liquid storage 11. Since hydrogen peroxide is easily decomposed into water and oxygen at a higher temperature, the second SPM (sulfuric acid-containing liquid) recovered in the reclaim tank 21 contains water. However, the second SPM (sulfuric acid-containing liquid) contains sulfuric acid in not less than 50%. The second SPM (sulfuric acid-containing liquid) recovered in the reclaim tank 21 is mixed with the sulfuric acid-containing liquid in the first circulation tank 22 and with the sulfuric acid-containing liquid in the second circulation tank 51, and circulated through the second circulation tank 51 and the second circulation pipes 53 (through the common pipe 51A and the sulfuric acid-containing liquid flowing pipes 51B). The sulfuric acid concentration of the sulfuric acid-containing liquid thus circulated is measured by the sulfuric acid concentration meter 64 (S16 in FIG. 9). The control device 4 monitors the sulfuric acid concentration of the sulfuric acid-containing liquid circulated through the second circulation tank 51 and the second circulation pipes 53 based on the measurement value of the sulfuric acid concentration meter 64 (S17 in FIG. 9).

If the sulfuric acid concentration of the sulfuric acid-containing liquid measured by the sulfuric acid concentration meter 64 is the lower limit value or higher (YES in S17 in FIG. 9), the control device 4 opens the sulfuric acid-containing liquid valve 60. Thus, the sulfuric acid-containing liquid flowing through the sulfuric acid-containing liquid flowing pipe 51B flows through the sulfuric acid-containing liquid supply pipe 57 to be supplied to the SPM nozzle 13. Thus, the sulfuric acid-containing liquid prepared from the second SPM expelled from the substrate W is mixed with hydrogen peroxide water, whereby the SPM is newly prepared. The newly prepared SPM is supplied to the subsequent substrate W. Since the SPM expelled from the substrate W is reused, the amount of the SPM to be discarded can be reduced.

If the sulfuric acid concentration of the sulfuric acid-containing liquid measured by the sulfuric acid concentration meter 64 is less than the lower limit value (NO in S17 in FIG. 9), on the other hand, the control device 4 opens the sulfuric acid addition valve 45 provided in the sulfuric acid addition pipe 44 to add sulfuric acid into the first circulation tank 22 (S18 in FIG. 9). Since fresh sulfuric acid is added into the first circulation tank 22, the sulfuric acid concentration of the sulfuric acid-containing liquid circulated through the first circulation tank 22 and the first circulation pipe 23 is increased. Thereafter, the sulfuric acid-containing liquid circulated through the first circulation tank 22 and the first circulation pipe 23 is supplied to the second circulation tank 51 through the first liquid guide pipe 31, whereby the sulfuric acid concentration of the sulfuric acid-containing liquid circulated through the second circulation tank 51 and the second circulation pipes 53 (the common pipe 51A and the sulfuric acid-containing liquid flowing pipes 51B) is increased. Accordingly, the sulfuric acid concentration of the sulfuric acid-containing liquid thus circulated is maintained at a higher level.

In the exemplary substrate treatment described with reference to FIGS. 7 to 9, the sulfuric acid-containing liquid and hydrogen peroxide water are mixed together to prepare the first SPM, and the prepared first SPM is supplied to the substrate W. After the supply of the first SPM is stopped, the sulfuric acid-containing liquid and hydrogen peroxide water are mixed together to prepare the second SPM, and the prepared second SPM is supplied to the substrate W. Thus, the first SPM and the second SPM are supplied to the substrate W, whereby the resist is removed from the substrate W.

When the first SPM is prepared, the sulfuric acid-containing liquid and hydrogen peroxide water are mixed in the first mixing ratio. When the second SPM is prepared, the sulfuric acid-containing liquid and hydrogen peroxide water are mixed in the second mixing ratio. The first mixing ratio and the second mixing ratio are each defined as the ratio of the volume of the sulfuric acid-containing liquid before the mixing to the volume of hydrogen peroxide water before the mixing. The first mixing ratio is smaller than the second mixing ratio. Therefore, the concentration of hydrogen peroxide contained in the first SPM is higher than the concentration of hydrogen peroxide contained in the second SPM.

Since the hydrogen peroxide concentration is relatively high, the first SPM has a higher removal capability than the second SPM. Therefore, the resist can be efficiently removed from the substrate W. After the first SPM is supplied to the substrate, the second SPM is supplied to the substrate W. The second SPM has a lower removal capability than the first SPM. Since almost all the resist is removed from the substrate W by supplying the first SPM to the substrate W, only an easily removable part of the resist remains on the substrate W. Further, the temperature of the SPM (second SPM) to be supplied to the substrate W is adjusted at a very high level (about 190° C. to about 220° C.) and, therefore, the removal capability of the second SPM is high though being poorer than that of the first SPM. Therefore, even the second SPM having a lower removal capability can reliably remove the remaining resist from the substrate W.

The first SPM expelled from the substrate W flows into the first liquid drain pipe 152 but not into the recovery pipe 156. The first SPM expelled from the substrate W has a relatively high hydrogen peroxide concentration and a relatively low sulfuric acid concentration. In addition, the first SPM expelled from the substrate W contains a greater amount of contaminants (carbides of the resist and the like) generated by a reaction between the first SPM and the resist. Therefore, the first SPM expelled from the substrate W is inappropriate for the recovery.

On the other hand, the second SPM expelled from the substrate W has a relatively high sulfuric acid concentration. Further, the second SPM expelled from the substrate W contains the contaminants in a smaller amount than the first SPM expelled from the substrate W. Therefore, the second SPM having a relatively high sulfuric acid concentration and a smaller contaminant amount is guided to the recovery pipe 156, and mixed again with hydrogen peroxide water. Thus, sulfuric acid contained in the second SPM reacts with hydrogen peroxide water, whereby SPM is newly prepared. Accordingly, the amount of the SPM to be discarded can be reduced.

Thus, the SPM is recovered when the sulfuric acid concentration, i.e., the ratio of the volume of sulfuric acid before the mixing to the total volume of sulfuric acid and hydrogen peroxide water before the mixing, is high. Therefore, the SPM having a higher sulfuric acid concentration can be recovered. Further, the SPM having a higher hydrogen peroxide concentration and a sufficient removal capability is supplied to the substrate W before the recovery of the SPM is started without maintaining the sulfuric acid concentration at a higher level. Therefore, the resist can be efficiently removed from the substrate W. This makes it possible to recover the SPM having a higher sulfuric acid concentration while efficiently removing the resist from the substrate W.

In this exemplary substrate treatment, the first SPM expelled from the substrate W is received by the first guard 143 surrounding the substrate W. The second SPM expelled from the substrate W is received by the second guard 144 surrounding the substrate W. The first SPM received by the first guard 143 flows into the first liquid drain pipe 152 connected to the first guard 143. The second SPM received by the second guard 144 flows into the recovery pipe 156 connected to the second guard 144.

The first SPM expelled from the substrate W contains a greater amount of contaminants. After the first guard 143 receives the first SPM, therefore, the contaminants are liable to remain on the inner peripheral surface of the first guard 143. If the second SPM expelled from the substrate W is received by the first guard 143 to be recovered, the second SPM is liable to be contaminated with the contaminants adhering to the first guard 143. Therefore, the second SPM is received by the second guard 144 different from the first guard 143, whereby the amount of the contaminants contained in the recovered SPM can be reduced.

In this exemplary substrate treatment, the first SPM expelled from the substrate W when the supply of the first SPM is stopped is received by the first guard 143. Thereafter, the first guard 143 and the second guard 144 are switched from the first opposed state to the second opposed state, whereby the second SPM expelled from the substrate W is received by the second guard 144. That is, after the expelling of the first SPM having a greater contaminant amount is completed, the state in which the first guard 143 is directly opposed to the substrate W is switched to the state in which the second guard 144 is directly opposed to the substrate W. Thus, the second guard 144 is prevented from being contaminated with the first SPM having a greater contaminant amount.

Figure 10:
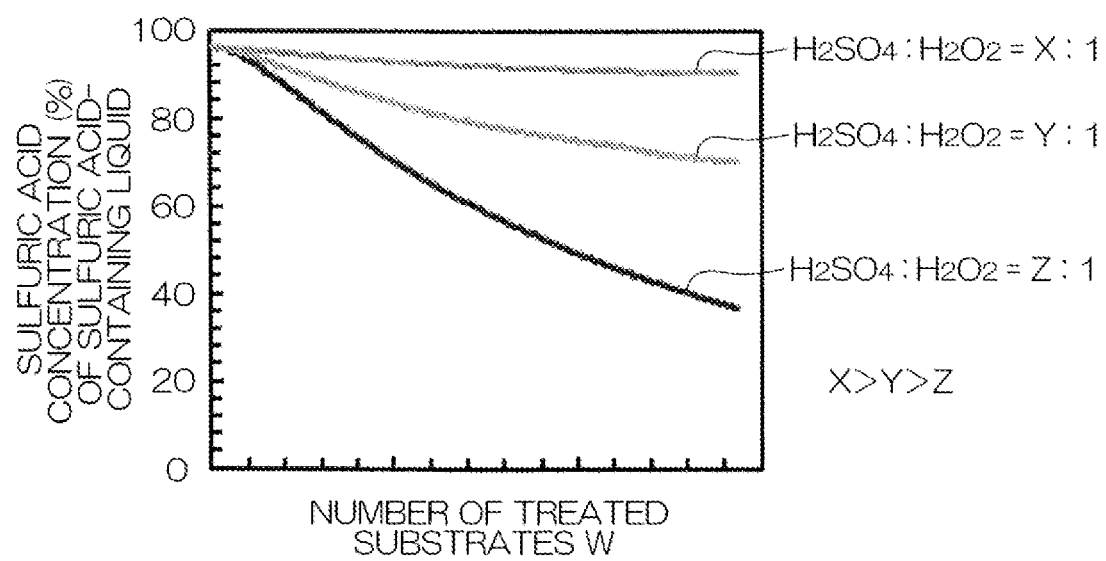
FIG. 10 is a graph showing a change in the sulfuric acid concentration of the recovered sulfuric acid-containing liquid.

FIG. 10 is a graph showing a change in the sulfuric acid concentration of the recovered sulfuric acid-containing liquid. The ordinate in FIG. 10 indicates the sulfuric acid concentration of the recovered sulfuric acid-containing liquid, and the abscissa in FIG. 10 indicates the number of substrates W treated by the substrate processing apparatus 1. In FIG. 10, the ratio X, the ratio Y, and the ratio Z each indicate the ratio of the flow rate of the sulfuric acid-containing liquid with respect to the flow rate of hydrogen peroxide water regarded as 1. The ratio X is greater than the ratio Y, and the ratio Y is greater than the ratio Z ((ratio X)>(ratio Y)>(ratio Z)).

As can be understood from FIG. 10, for any of the sulfuric acid-containing liquid ratios X, Y, Z, the sulfuric acid concentration of the sulfuric acid-containing liquid is reduced, as the number of the treated substrates W increases. The reduction rate of the sulfuric acid concentration is increased, as the sulfuric acid-containing liquid ratio decreases. That is, where the sulfuric acid-containing liquid ratio is the ratio Z, the reduction rate of the sulfuric acid concentration of the sulfuric acid-containing liquid is the greatest. Where the sulfuric acid-containing liquid ratio is the ratio Y, the reduction rate of the sulfuric acid concentration of the sulfuric acid-containing liquid is the second greatest. In other words, the sulfuric acid concentration of the sulfuric acid-containing liquid is unlikely to decrease, if the sulfuric acid-containing liquid ratio is high. It was confirmed that, even if 100 or more substrates W are treated while the SPM is supplied to and recovered from the substrates W with the sulfuric acid-containing liquid ratio set to the ratio X, the sulfuric acid concentration of the sulfuric acid-containing liquid is only reduced to about 90%.

In this embodiment, as described above, the SPM containing the sulfuric acid-containing liquid having a higher sulfuric acid concentration is recovered in the sulfuric acid-containing liquid supply device 8, and the recovered SPM is reused as the sulfuric acid-containing liquid. As can be understood from FIG. 10, the reduction rate of the sulfuric acid concentration is increased, as the sulfuric acid-containing liquid ratio decreases. Therefore, the sulfuric acid concentration of the sulfuric acid-containing liquid is unlikely to decrease even when a greater number of substrates W are treated, if the ratio of the sulfuric acid-containing liquid recovered in the sulfuric acid-containing liquid supply device 8 is greater. Therefore, the sulfuric acid concentration of the sulfuric acid-containing liquid recovered in the sulfuric acid-containing liquid supply device 8 can be maintained at a level suitable for the reuse. This makes it possible to reduce the frequency of replacing the sulfuric acid-containing liquid with fresh sulfuric acid in the first circulation tank 22 and the second circulation tank 51, and the frequency of adding fresh sulfuric acid to the first circulation tank 22. Therefore, the consumption of sulfuric acid (i.e., the amount of sulfuric acid to be discarded) can be reduced.

According to this embodiment, as described above, the storage for the adjustment of the sulfuric acid concentration (first liquid storage 11) and the storage for the temperature adjustment (second liquid storage 12) are separately provided in the sulfuric acid-containing liquid supply device 8. If the temperature of the sulfuric acid-containing liquid is adjusted in the second liquid storage 12 adapted for the temperature adjustment while sulfuric acid is added to the second liquid storage 12, the temperature of the sulfuric acid-containing liquid will become unstable in the storage because the temperature of sulfuric acid to be added is a room temperature. In this embodiment, the first liquid storage 11 for the adjustment of the sulfuric acid concentration and the second liquid storage 12 for the temperature adjustment are separately provided, so that the temperature of the sulfuric acid-containing liquid in the second liquid storage 12 is stabilized. Thus, the sulfuric acid-containing liquid to be supplied to the SPM nozzles 13 can be adjusted at the desired high temperature.

In this embodiment, the sulfuric acid-containing liquid is heated by the second and first circulation heaters 52 and 24 in the first liquid storage 11 and the second liquid storage 12, respectively. Therefore, a greater heat amount can be applied to the sulfuric acid-containing liquid. Further, the sulfuric acid-containing liquid temperature-adjusted at the first temperature (about 120° C. to about 130° C.) in the first liquid storage 11 is supplied to the second liquid storage 12. Then, the sulfuric acid-containing liquid is heated to the second temperature (about 160° C.) in the second liquid storage 12. That is, the sulfuric acid-containing liquid is heated stepwise. Therefore, the temperature of the sulfuric acid-containing liquid can be increased to a higher temperature in the second liquid storage 12.

Further, the sulfuric acid-containing liquid circulated through the second circulation tank 51 and the second circulation pipes 53 is guided to the sulfuric acid-containing liquid supply pipes 57. Then, the sulfuric acid-containing liquid flowing through the sulfuric acid-containing liquid supply pipes 57 is heated by the heaters 54. The sulfuric acid-containing liquid can be heated by the heaters 54 to the third temperature (about 165° C.) that is still higher than when being circulated through the second circulation tank 51 and the second circulation pipes 53.

The second SPM having the second mixing ratio has a lower removal capability than the first SPM. However, the removal capability of the SPM depends not only on the hydrogen peroxide concentration but also on the temperature of the SPM. That is, the removal capability of the SPM is increased, as the temperature of the SPM is increased. The temperature of the SPM after the mixing is increased, as the temperature of the sulfuric acid-containing liquid is increased. Even if the mixing ratio is the second mixing ratio, therefore, the removal capability of the SPM can be kept at a higher level by increasing the temperature of the sulfuric acid-containing liquid before the mixing. Thus, the resist can be efficiently removed from the substrate W even with the use of the SPM having the second mixing ratio.

In this embodiment, the sulfuric acid concentration of the sulfuric acid-containing liquid circulated through the second circulation tank 51 and the second circulation pipes 53 is measured by the sulfuric acid concentration meter 64. Therefore, the sulfuric acid concentration of the sulfuric acid-containing liquid circulated through the second circulation tank 51 and the second circulation pipes can be accurately determined. If the sulfuric acid concentration measured by the sulfuric acid concentration meter 64 is reduced below the lower limit value, sulfuric acid is supplied to the first circulation tank 22 by the sulfuric acid adding unit 25. Thus, the sulfuric acid concentration of the sulfuric acid-containing liquid to be supplied to the SPM nozzles 13 can be adjusted at the desired higher concentration.

In this embodiment, both the first circulation heater 24 and the second circulation heater 52 are used to heat the sulfuric acid-containing liquid. Therefore, the load to be exerted on the second circulation heater 52 can be reduced as compared with a case in which the sulfuric acid-containing liquid is heated only by the second circulation heater 52.

Figure 11:
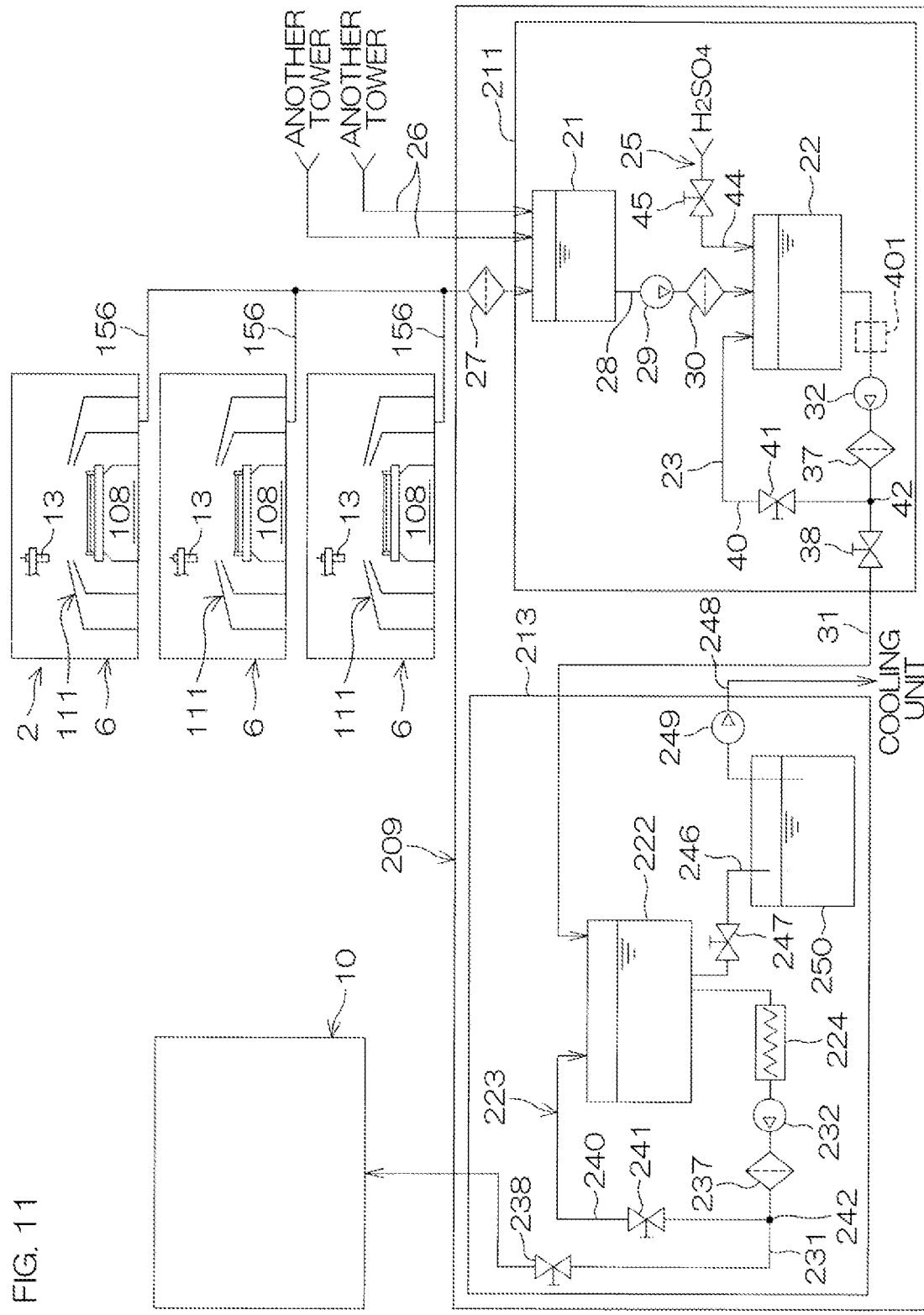
FIG. 11 is a diagram of a first sulfuric acid-containing liquid supply device according to a second embodiment of the present invention as seen in a horizontal direction.

FIG. 11 is a diagram of a first sulfuric acid-containing liquid supply device 209 according to a second embodiment of the present invention as seen in a horizontal direction. In FIG. 11, the same components as in FIGS. 1 to 10 will be denoted by the same reference characters as in FIG. 1 and the like, and the description thereof will be omitted.

The first sulfuric acid-containing liquid supply device 209 according to the second embodiment is different from the first sulfuric acid-containing liquid supply device 9 according to the first embodiment in that a third liquid storage 213 is provided in addition to the first liquid storage. The sulfuric acid-containing liquid is supplied to the third liquid storage 213 from the first liquid storage, and the sulfuric acid-containing liquid stored in the third liquid storage 213 is supplied to the second liquid storage 12.

Further, the first liquid storage 211 is different from the first liquid storage 11 according to the first embodiment in that the first circulation heater 24 is not provided. Further, the first liquid storage 211 does not include the liquid drain tank 50. That is, the first liquid storage 211 does not include the unit which heats the sulfuric acid-containing liquid circulated through the first circulation tank 22 and the first circulation pipe 23.

The SPM recovered in the reclaim tank 21 is stored as the sulfuric acid-containing liquid in the reclaim tank 21. The SPM expelled from the substrate W flows through the treatment cup 111, the recovery pipe 156, and the recovery outlet pipe 26 to be thereby cooled, and is recovered in the reclaim tank 21. Therefore, the temperature of the SPM recovered in the reclaim tank 21 is much lower than the temperature of the SPM to be supplied to the substrate W (about 190° C. to about 220° C.), but is still relatively high (about 80° C. to about 90° C.)

The sulfuric acid-containing liquid stored in the reclaim tank 21 is supplied to the first circulation tank 22 through the transport pipe 28 by driving the first liquid pumping device 29. Then, the sulfuric acid-containing liquid is circulated through the first circulation tank 22 and the first circulation pipe 23. The temperature of the sulfuric acid-containing liquid is lowered, because the sulfuric acid-containing liquid is deprived of heat by the pipe wall of the transport pipe 28 and the pipe wall of the first circulation pipe 23 when flowing through the transport pipe 28 and the first circulation pipe 23. The temperature of the sulfuric acid-containing liquid circulated through the first circulation tank 22 and the first circulation pipe 23 is higher than the room temperature (about 23° C. to about 25° C.) but maintained at a fourth temperature (about 40° C. to about 60° C.) that is lower than the sulfuric acid-containing liquid stored in the reclaim tank 21 due to thermal equilibrium with respect to the pipe wall of the first circulation pipe 23.

The third liquid storage 213 of the first sulfuric acid-containing liquid supply device 209 includes a third circulation tank (third tank) 222, a third circulation pipe (third pipe) 223, and a third circulation heater (second heater) 224.

A downstream end of the first liquid guide pipe 31 is connected to the third circulation tank 222. The sulfuric acid-containing liquid having the fourth temperature (e.g., about 40° C. to about 60° C.) in the first liquid storage 211 is guided to the third circulation tank 222. Then, the guided sulfuric acid-containing liquid is stored in the third circulation tank 222 (third storing step).

A second liquid guide pipe 231 extending to the second sulfuric acid-containing liquid supply device 10 (second liquid storage 12) is connected to the third circulation tank 222. A downstream end of the second liquid guide pipe 231 is connected to the second circulation tank 51 of the second liquid storage 12. A fifth liquid pumping device 232 such as a pump for pumping out the sulfuric acid-containing liquid from the third circulation tank 222 is provided in the second liquid guide pipe 231. A fourth capturing filter 237 and an on/off valve 238 are provided downstream of the fifth liquid pumping device 232 in the second liquid guide pipe 231. The fourth capturing filter 237 is a filter adapted to capture and remove relatively small foreign matter from the sulfuric acid-containing liquid flowing through the second liquid guide pipe 231. The fourth capturing filter 237 removes foreign matter which cannot be completely removed by the third capturing filter 37.

The on/off valve 238 is a valve for controlling the on and off of the flow of the sulfuric acid-containing liquid in the second liquid guide pipe 231.

A return pipe 240 is branched from the second liquid guide pipe 231 at a position between the on/off valve 238 and the fourth capturing filter 237. A downstream portion of the return pipe 240 extends to the third circulation tank 222. A return valve 241 is provided in the return pipe 240. The third circulation pipe 223 is constituted by the return pipe 240 and a portion of the second liquid guide pipe 231 upstream of the branch position 242 at which the return pipe 240 is branched.

During the operation of the substrate processing apparatus (including a period in which the treatment of the substrate W is halted), the fifth liquid pumping device 232 and the third circulation heater 224 are constantly driven. With the on/off valve 238 closed and with the return valve 241 open, therefore, the sulfuric acid-containing liquid pumped out from the third circulation tank 222 flows to the branch position 242 through the second liquid guide pipe 231, and flows back to the third circulation tank 222 from the branch position 242 through the return pipe 240. That is, the sulfuric acid-containing liquid is circulated through the third circulation tank 222 and the third circulation pipe 223 during a period in which the sulfuric acid-containing liquid is not supplied to the second liquid storage 12. When the sulfuric acid-containing liquid is to be supplied to the second liquid storage 12, the on/off valve 238 is opened and the return valve 241 is closed, whereby the sulfuric acid-containing liquid pumped out from the third circulation tank 222 is supplied to the second liquid storage 12 through the second liquid guide pipe 231.

The third circulation heater 224 is provided in the second liquid guide pipe 231 upstream of the fifth liquid pumping device 232. The third circulation heater 224 heats the sulfuric acid-containing liquid circulated through the third circulation tank 222 and the third circulation pipe 223 (third heating step). The heating temperature of the third circulation heater 224 is set to a predetermined first temperature (second heating temperature), e.g., about 120° C. to about 130° C. The sulfuric acid-containing liquid is conditioned at the first temperature by the circulation of the sulfuric acid-containing liquid through the third circulation tank 222 and the third circulation pipe 223. During the period in which the sulfuric acid-containing liquid is not supplied to the second liquid storage 12, the sulfuric acid-containing liquid conditioned at the first temperature can be stored in the third circulation tank 222 by the circulation of the sulfuric acid-containing liquid. After the on/off valve 238 is opened, the sulfuric acid-containing liquid conditioned at the first temperature is supplied to the second liquid storage 12.

The third liquid storage 213 includes a liquid drain pipe 246, a liquid drain valve 247, an outlet pipe 248, a sixth liquid pumping device 249, and a liquid drain tank 250. The liquid drain pipe 246, the liquid drain valve 247, the outlet pipe 248, the sixth liquid pumping device 249, and the liquid drain tank 250 respectively have the same structures and the same functions as the liquid drain pipe 46, the liquid drain valve 47, the outlet pipe 48, the third liquid pumping device 49, and the liquid drain tank 50.

The second embodiment has the following effects in addition to the effects provided by the first embodiment described above.

More specifically, a unit for heating the sulfuric acid-containing liquid circulated through the first circulation tank 22 and the first circulation pipe 23 is not provided in the first liquid storage 211. That is, the sulfuric acid-containing liquid is not heated in the first liquid storage 211. Therefore, the temperature of the sulfuric acid-containing liquid circulated through the first circulation tank 22 and the first circulation pipe 23 is relatively low (about 40° C. to about 60° C.). Therefore, the temperature of the sulfuric acid-containing liquid passing through the third capturing filter 37 is relatively low.

If the sulfuric acid-containing liquid having a higher temperature (about 120° C. to about 130° C.) is circulated through the first circulation tank 22 and the first circulation pipe 23 as in the first embodiment, the sulfuric acid-containing liquid having a higher temperature (about 120° C. to about 130° C.) continuously flows through the third capturing filter 37 to expand the filter, whereby the diameter of each of the pores 71 (see FIG. 3) is liable to be increased. If the diameter of each of the pores 71 (see FIG. 3) is increased, the diameter of foreign matter capturable by the third capturing filter 37 is increased. Therefore, the filtering capability of the third capturing filter 37 is liable to be reduced, so that the foreign matter contained in the sulfuric acid-containing liquid cannot be properly captured in the first liquid storage.

In the second embodiment, the temperature of the sulfuric acid-containing liquid passing through the third capturing filter 37 is relatively low (about 40° C. to about 60° C.), so that the reduction in the filtering capability of the third capturing filter 37 can be suppressed. Therefore, the foreign matter contained in the sulfuric acid-containing liquid can be properly captured in the first liquid storage 211. Thus, the sulfuric acid-containing liquid can be supplied in a clean state to the SPM nozzles 13.

In the second embodiment, the sulfuric acid-containing liquid supplied from the first liquid storage 211 is circulated through the third circulation tank 222 and the third circulation pipe 223 in the third liquid storage 213. The sulfuric acid-containing liquid circulated through the third circulation tank 222 and the third circulation pipe 223 is heated by the third circulation heater 224. In the third liquid storage 213 and the second liquid storage 12, the sulfuric acid-containing liquid is heated by the third circulation heater 224 and the second circulation heater 52, respectively. Since a greater amount of heat can be applied to the sulfuric acid-containing liquid, the temperature of the sulfuric acid-containing liquid can be increased to a higher level in the second liquid storage 12.

Further, both the third circulation heater 224 and the second circulation heater 52 are used for heating the sulfuric acid-containing liquid. Therefore, the load to be exerted on one of the heaters (i.e., the second circulation heater 52) can be reduced.

Figure 12:
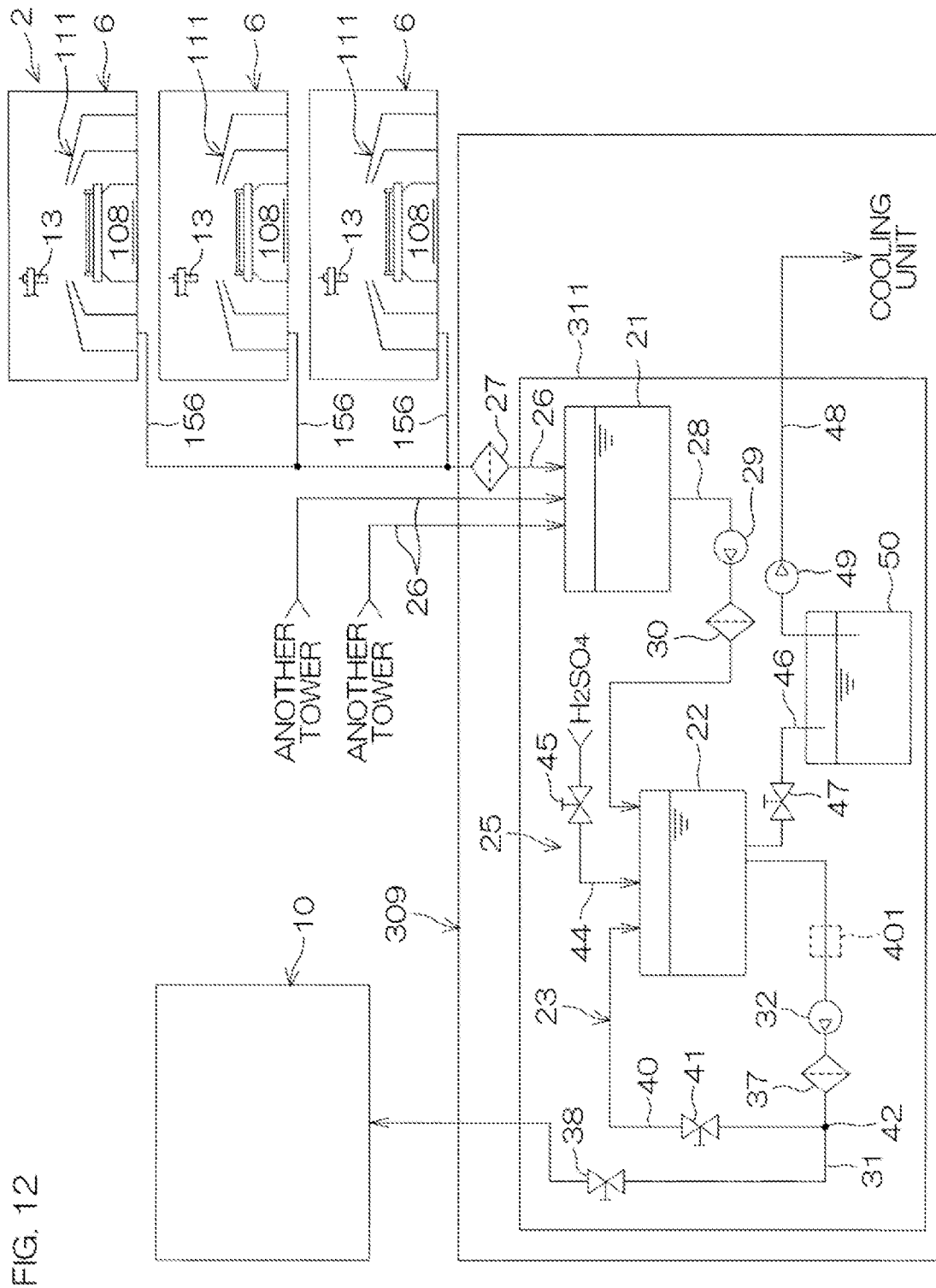
FIG. 12 is a diagram of a first sulfuric acid-containing liquid supply device according to a third embodiment of the present invention as seen in a horizontal direction.

FIG. 12 is a diagram of a first sulfuric acid-containing liquid supply device 309 according to a third embodiment of the present invention as seen in a horizontal direction. In FIG. 12, the same components as in FIGS. 1 to 10 will be denoted by the same reference characters as in FIG. 1 and the like, and the description thereof will be omitted.

A first liquid storage 311 of the first sulfuric acid-containing liquid supply device 309 according to the third embodiment is different from the first liquid storage of the first sulfuric acid-containing liquid supply device 9 according to the first embodiment in that the first circulation heater 24 is not provided. Except for that, the first liquid storage 311 has substantially the same structure as the first liquid storage 11.

As described above, the temperature of the SPM recovered in the reclaim tank 21 is much lower than the temperature of the SPM to be supplied to the substrate W (about 190° C. to about 220° C.), but is still relatively high, i.e., about 80° C. to about 90° C. As described above, the temperature of the sulfuric acid-containing liquid circulated through the first circulation tank 22 and the first circulation pipe 23 is higher than the room temperature (about 23° C. to about 25° C.) but is maintained at the fourth temperature (about 40° C. to about 60° C.) that is lower than the temperature of the sulfuric acid-containing liquid stored in the reclaim tank 21 due to thermal equilibrium with respect to the pipe wall of the first circulation pipe 23. Then, the sulfuric acid-containing liquid circulated through the first circulation tank 22 and the first circulation pipe 23 is supplied to the second liquid storage 12 of the second sulfuric acid-containing liquid supply device 10.

In the second liquid storage 12, the sulfuric acid-containing liquid circulated through the second circulation tank 51 and the second circulation pipes 53 is heated by the second circulation heater 52, whereby the temperature of the circulated sulfuric acid-containing liquid is increased to the second temperature.

In the third embodiment, the temperature of the sulfuric acid-containing liquid passing through the third capturing filter 37 is relatively low (about 40° C. to about 60° C.), so that the reduction in the filtering capability of the third capturing filter 37 can be suppressed. Therefore, the foreign matter contained in the sulfuric acid-containing liquid can be properly captured in the first liquid storage 311. Thus, the sulfuric acid-containing liquid can be supplied in a clean state to the SPM nozzles 13.

While the three embodiments of the present invention have thus been described, the present invention may be embodiment in other ways.

In the second and third embodiments described above, for example, as indicated by broken lines in FIGS. 11 and 12, the first liquid storages 211, 311 may each further include a cooler 401 for cooling the sulfuric acid-containing liquid circulated through the first circulation tank 22 and the first circulation pipe 23. The cooler 401 is disposed, for example, in the first liquid guide pipe 31 upstream of the second liquid pumping device 32. In this case, the sulfuric acid-containing liquid is cooled by the circulation of the sulfuric acid-containing liquid through the first circulation tank 22 and the first circulation pipe 23. Depending on the setting of the cooling temperature of the cooler 401, the temperature of the sulfuric acid-containing liquid circulated through the first circulation tank 22 and the first circulation pipe 23 can be reduced to the room temperature (about 23° C. to about 25° C.) or a temperature lower than the room temperature.

Figure 13:
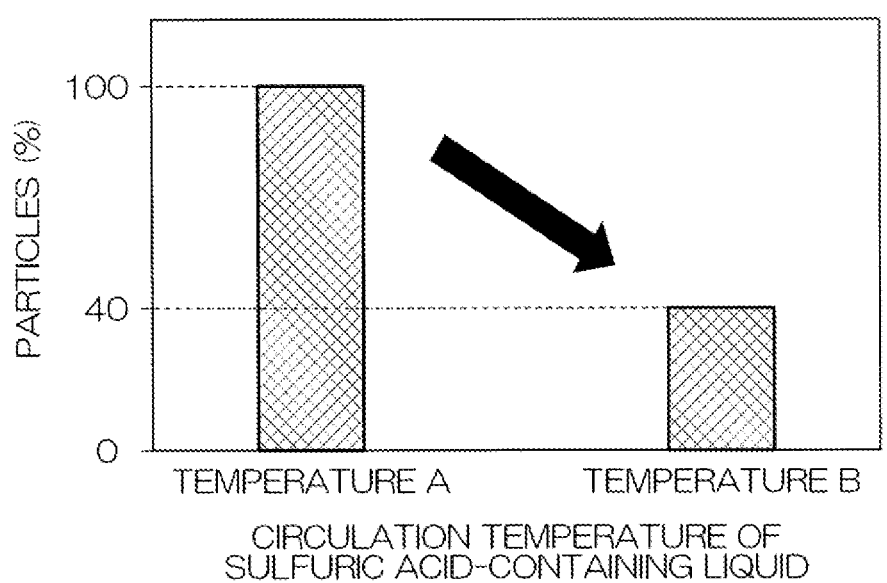
FIG. 13 is a diagram for describing a change in the filtering capability of a capturing filter due to thermal influence.

FIG. 13 is a diagram for describing a change in the filtering capability of a capturing filter (third capturing filter 37) due to thermal influence. As shown in FIG. 13, the filtering capability of the capturing filter is improved (i.e., relatively small foreign matter (fine particles) can be more advantageously captured), as the temperature (circulation temperature) of the sulfuric acid-containing liquid passing through the capturing filter (third capturing filter 37) is reduced. It is herein assumed that the passage rate of the fine particles observed when the temperature of the sulfuric acid-containing liquid passing through the capturing filter is set to a level (temperature A) lower than the temperature of the sulfuric acid-containing liquid stored in the reclaim tank is a reference passage rate (100%). Where the temperature of the sulfuric acid-containing liquid flowing through the capturing filter is reduced to an ordinary temperature (temperature B), the passage rate of the fine particles is reduced to 40%, further improving the filtering capability. On the other hand, though not shown, where the temperature of the sulfuric acid-containing liquid is 80° C. or higher, the passage rate of the fine particles is significantly increased as compared with the reference passage rate (100%), deteriorating the filtering capability. With the provision of the cooler 401, therefore, the relatively small foreign matter contained in the sulfuric acid-containing liquid can be more advantageously captured in the first liquid storage 211, 311. This makes it possible to supply the sulfuric acid-containing liquid in a cleaner state to the SPM nozzles 13.

As indicated by broken lines in FIG. 4, the second liquid storage 12 may include a sulfuric acid supply unit 402 which supplies fresh sulfuric acid (sulfuric acid yet to be used for the treatment of the substrate W) to the second circulation tank 51. The sulfuric acid supply unit 402 includes a sulfuric acid supply pipe 403 through which sulfuric acid is supplied to the second circulation tank 51, and a sulfuric acid supply valve 404 which opens and closes the sulfuric acid supply pipe 403. Sulfuric acid to be supplied to the sulfuric acid supply pipe 403 is unused sulfuric acid (e.g., concentrated sulfuric acid).

The supply of sulfuric acid from the sulfuric acid supply unit 402 is not intended to increase the sulfuric acid concentration of the sulfuric acid-containing liquid circulated through the second circulation tank 51 and the second circulation pipes 53 by the addition of sulfuric acid, but is solely intended to store the sulfuric acid-containing liquid in the second circulation tank 51 at the startup of the substrate processing apparatus 1.

The in-nozzle mixing method is employed in which the sulfuric acid-containing liquid and hydrogen peroxide water are mixed together in the SPM nozzle 13, as described above, but an in-pipe mixing method may be employed in which the sulfuric acid-containing liquid and hydrogen peroxide water are mixed together in a treatment liquid pipe connected to the nozzle or in a mixing pipe connected to the treatment liquid pipe.

In the first liquid storage 11, 211, 311, as described above, the SPM from the recovery outlet pipe 26 is once recovered in the reclaim tank 21 and then stored in the first circulation tank 22, but the SPM may be stored directly in the first circulation tank 22 without the recovery in the reclaim tank 21. In this case, the reclaim tank 21 may be eliminated.

Further, the sulfuric acid concentration meter 64 may be provided in each of the sulfuric acid-containing liquid flowing pipes 51B, but not in one of the sulfuric acid-containing liquid flowing pipes 51B, associated with the respective towers. The sulfuric acid concentration meter 64 may be provided in the second circulation tank 51 and/or the common pipe 51A, but not in the sulfuric acid-containing liquid flowing pipe 51B. The sulfuric acid concentration of the sulfuric acid-containing liquid prepared in the sulfuric acid-containing liquid supply device 8 may be determined by measurement of the sulfuric acid concentration of the sulfuric acid-containing liquid circulated through the first circulation tank 22 and the first circulation pipe 23 instead of or in addition to the measurement of the sulfuric acid concentration of the sulfuric acid-containing liquid circulated through the second circulation tank 51 and the second circulation pipe 53.

Further, the single sulfuric acid-containing liquid supply device including the single first sulfuric acid-containing liquid supply device 9 and the single second sulfuric acid-containing liquid supply device 10 may be adapted to supply the sulfuric acid-containing liquid only to the treatment units 6 of the single tower rather than to supply the sulfuric acid-containing liquid to the treatment units 6 of the plurality of towers (three towers). That is, the first circulation tank 22 and the second circulation tank 51 may be provided in pair for each of the towers of the treatment units 6. In this case, the opposite ends of the sulfuric acid-containing liquid flowing pipe 51B are connected to the second circulation tank 51 without the provision of the common pipe 51A. That is, the second circulation pipe 53 can be constituted only by the sulfuric acid-containing liquid flowing pipe 51B.

In this embodiment, the first liquid storage 11, 211, 311 and/or the third liquid storage 213 may be provided together in the clean room (on the same floor as the second liquid storage 12) rather than on a floor different from the floor on which the second liquid storage 12 is provided. In this case, the first liquid storage 11, 211, 311 and/or the third liquid storage 213 and the second liquid storage 12 may be disposed in a common frame rather than in different frames.

In the embodiments described above, the substrate processing apparatus 1 is adapted to treat semiconductor wafers as the substrates W, but the substrate processing apparatus may be adapted to treat substrates for liquid crystal display devices, substrates for FPDs (Flat Panel Displays) such as organic EL (electroluminescence) display devices, substrates for optical disks, substrates for magnetic disks, substrates for magneto-optical disks, substrates for photomasks, ceramic substrates, and substrates for solar cells.

Various modifications may be made within the scope of the following claims.

This application corresponds to Japanese Patent Application No. 2018-176394 filed on Sep. 20, 2018, the disclosure of which is incorporated herein by reference in its entirety.

REFERENCE SIGNS LIST

1: SUBSTRATE PROCESSING APPARATUS
4: CONTROL DEVICE
6: TREATMENT UNIT
8: SULFURIC ACID-CONTAINING LIQUID SUPPLY DEVICE
11: FIRST LIQUID STORAGE
12: SECOND LIQUID STORAGE
13: SPM NOZZLE (NOZZLE)
13a: INSIDE OF SPM NOZZLE (MIXING PORTION)
22: FIRST CIRCULATION TANK (FIRST TANK)
23: FIRST CIRCULATION PIPE (SECOND PIPE)
24: FIRST CIRCULATION HEATER (SECOND HEATER)
25: SULFURIC ACID ADDING UNIT
37: THIRD CAPTURING FILTER (FILTER)
51: SECOND CIRCULATION TANK (SECOND TANK)
52: SECOND CIRCULATION HEATER (FIRST HEATER)
53: SECOND CIRCULATION PIPE (FIRST PIPE)
54: HEATER (THIRD HEATER)
59: SULFURIC ACID-CONTAINING LIQUID FLOW RATE CONTROL VALVE (MIXING RATIO CHANGING UNIT)
64: SULFURIC ACID CONCENTRATION METER
108: SPIN CHUCK (SUBSTRATE HOLDING UNIT)
122: HYDROGEN PEROXIDE WATER SUPPLY UNIT
137: HYDROGEN PEROXIDE WATER FLOW RATE CONTROL VALVE (MIXING RATIO CHANGING UNIT)
143: FIRST GUARD
144: SECOND GUARD
146: GUARD LIFT UNIT (GUARD SWITCHING UNIT)
156: RECOVERY PIPE
157: SECOND LIQUID DRAIN PIPE (LIQUID DRAIN PIPE)
209: FIRST SULFURIC ACID-CONTAINING LIQUID SUPPLY DEVICE
211: FIRST LIQUID STORAGE
213: THIRD LIQUID STORAGE
222: THIRD CIRCULATION TANK (THIRD TANK)
223: THIRD CIRCULATION PIPE (THIRD PIPE)
224: THIRD CIRCULATION HEATER (THIRD HEATER)
248: OUTLET PIPE
309: FIRST SULFURIC ACID-CONTAINING LIQUID SUPPLY DEVICE
311: FIRST LIQUID STORAGE
401: COOLER
W: SUBSTRATE

What is claimed is:

1. A substrate processing apparatus for removing a resist from a substrate with SPM that is a liquid mixture of sulfuric acid and hydrogen peroxide water, the apparatus comprising:
 a substrate holding unit which holds a substrate;
 a nozzle having a spout and adapted to spout SPM from the spout toward the substrate held by the substrate holding unit;
 a mixing portion communicating with the spout;
 a sulfuric acid-containing liquid supply device which recovers liquid supplied to and expelled from the substrate held by the substrate holding unit, prepares a sulfuric acid-containing liquid from the recovered liquid, and supplies the prepared sulfuric acid-containing liquid to the mixing portion; and
 a hydrogen peroxide water supply unit which supplies hydrogen peroxide water to the mixing portion;
 wherein the sulfuric acid-containing liquid supply device comprises a first liquid storage, and a second liquid storage,
 wherein the first liquid storage comprises:
 a first tank which stores the recovered liquid; and
 a sulfuric acid adding unit which adds sulfuric acid not originated from the recovered liquid to the first tank,
 wherein the second liquid storage comprises:
 a second tank which stores liquid supplied from the first tank;
 a first pipe having opposite ends connected to the second tank so that the liquid stored in the second tank is circulated therethrough; and a first heater which heats the liquid circulated through the second tank and the first pipe.

2. The substrate processing apparatus according to claim 1, wherein the second liquid storage further comprises a sulfuric acid concentration meter which measures a sulfuric acid concentration of the sulfuric acid-containing liquid circulated through the second tank and the first pipe.

3. The substrate processing apparatus according to claim 1, further comprising:
a sulfuric acid-containing liquid supply pipe which connects the second tank or the first pipe to the mixing portion; and
a third heater which heats a sulfuric acid-containing liquid flowing through the sulfuric acid-containing liquid supply pipe.

4. The substrate processing apparatus according to claim 1, further comprising:
a mixing ratio changing unit which changes a ratio of the sulfuric acid-containing liquid to hydrogen peroxide water in the mixing portion;
a recovery pipe through which the liquid supplied to and expelled from the substrate held by the substrate holding unit is recovered to be supplied to the sulfuric acid-containing liquid supply device;
a liquid drain pipe into which the liquid supplied to and expelled from the substrate held by the substrate holding unit flows; and
a switching unit which switches, between the liquid drain pipe and the recovery pipe, a pipe into which the liquid expelled from the substrate held by the substrate holding unit flows.

5. The substrate processing apparatus according to claim 4, further comprising:
a first guard which is connected to the liquid drain pipe and surrounds the substrate held by the substrate holding unit; and
a second guard which is connected to the recovery pipe and surrounds the substrate held by the substrate holding unit,
wherein the switching unit comprises a guard switching unit which switches the first guard and the second guard between a first state such that the liquid expelled from the substrate is received by the first guard and a second state such that the liquid expelled from the substrate is received by the second guard.

6. A substrate processing apparatus for removing a resist from a substrate with SPM that is a liquid mixture of sulfuric acid and hydrogen peroxide water, the apparatus comprising:
a substrate holding unit which holds a substrate;
a nozzle having a spout and adapted to spout SPM from the spout toward the substrate held by the substrate holding unit;
a mixing portion communicating with the spout;
a sulfuric acid-containing liquid supply device which recovers liquid supplied to and expelled from the substrate held by the substrate holding unit, prepares a sulfuric acid-containing liquid from the recovered liquid, and supplies the prepared sulfuric acid-containing liquid to the mixing portion; and
a hydrogen peroxide water supply unit which supplies hydrogen peroxide water to the mixing portion;
wherein the sulfuric acid-containing liquid supply device comprises a first liquid storage, and a second liquid storage, wherein the first liquid storage comprises:
a first tank which stores the recovered liquid; and
a sulfuric acid adding unit which adds sulfuric acid not originated from the recovered liquid to the first tank,
wherein the second liquid storage comprises:
a second tank which stores liquid supplied from the first tank;
a first pipe having opposite ends connected to the second tank so that the liquid stored in the second tank is circulated therethrough; and
a first heater which heats the liquid circulated through the second tank and the first pipe,
wherein the first liquid storage further comprises:
a second pipe having opposite ends connected to the first tank so that the sulfuric acid-containing liquid stored in the first tank is circulated therethrough; and
a second heater which heats the sulfuric acid-containing liquid circulated through the first tank and the second pipe.

7. The substrate processing apparatus according to claim 6, wherein the second liquid storage further comprises a sulfuric acid concentration meter which measures a sulfuric acid concentration of the sulfuric acid-containing liquid circulated through the second tank and the first pipe.

8. The substrate processing apparatus according to claim 6, wherein a first heating temperature to be achieved through the heating by the first heater is higher than a second heating temperature to be achieved through the heating by the second heater.

9. The substrate processing apparatus according to claim 6, further comprising:
a sulfuric acid-containing liquid supply pipe which connects the second tank or the first pipe to the mixing portion; and
a third heater which heats a sulfuric acid-containing liquid flowing through the sulfuric acid-containing liquid supply pipe.

10. The substrate processing apparatus according to claim 6, further comprising:
a mixing ratio changing unit which changes a ratio of the sulfuric acid-containing liquid to hydrogen peroxide water in the mixing portion;
a recovery pipe through which the liquid supplied to and expelled from the substrate held by the substrate holding unit is recovered to be supplied to the sulfuric acid-containing liquid supply device;
a liquid drain pipe into which the liquid supplied to and expelled from the substrate held by the substrate holding unit flows; and
a switching unit which switches, between the liquid drain pipe and the recovery pipe, a pipe into which the liquid expelled from the substrate held by the substrate holding unit flows.

11. The substrate processing apparatus according to claim 10, further comprising:
a first guard which is connected to the liquid drain pipe and surrounds the substrate held by the substrate holding unit; and
a second guard which is connected to the recovery pipe and surrounds the substrate held by the substrate holding unit,
wherein the switching unit comprises a guard switching unit which switches the first guard and the second guard between a first state such that the liquid expelled from the substrate is received by the first guard and a second state such that the liquid expelled from the substrate is received by the second guard.

12. A substrate processing apparatus for removing a resist from a substrate with SPM that is a liquid mixture of sulfuric acid and hydrogen peroxide water, the apparatus comprising:
- a substrate holding unit which holds a substrate;
- a nozzle having a spout and adapted to spout SPM from the spout toward the substrate held by the substrate holding unit;
- a mixing portion communicating with the spout;
- a sulfuric acid-containing liquid supply device which recovers liquid supplied to and expelled from the substrate held by the substrate holding unit, prepares a sulfuric acid-containing liquid from the recovered liquid, and supplies the prepared sulfuric acid-containing liquid to the mixing portion; and
- a hydrogen peroxide water supply unit which supplies hydrogen peroxide water to the mixing portion;
- wherein the sulfuric acid-containing liquid supply device comprises a first liquid storage, and a second liquid storage,
- wherein the first liquid storage comprises:
- a first tank which stores the recovered liquid; and
- a sulfuric acid adding unit which adds sulfuric acid not originated from the recovered liquid to the first tank,
- wherein the second liquid storage comprises:
- a second tank which stores liquid supplied from the first tank;
- a first pipe having opposite ends connected to the second tank so that the liquid stored in the second tank is circulated therethrough; and
- a first heater which heats the liquid circulated through the second tank and the first pipe,
- wherein the first liquid storage further comprises a second pipe having opposite ends connected to the first tank so that the sulfuric acid-containing liquid stored in the first tank is circulated therethrough,
- wherein the first liquid storage further comprises a filter provided in the second pipe for capturing foreign matter contained in the sulfuric acid-containing liquid flowing through the second pipe.

13. The substrate processing apparatus according to claim 12, wherein, in the first liquid storage, no heating unit is provided for heating the sulfuric acid-containing liquid circulated through the first tank and the second pipe.

14. The substrate processing apparatus according to claim 12,
- wherein the sulfuric acid-containing liquid supply device further comprises a third liquid storage,
- wherein the third liquid storage comprises:
- a third tank which stores the liquid supplied from the first tank;
- a third pipe having opposite ends connected to the third tank so that the liquid stored in the third tank is circulated therethrough; and
- a second heater which heats the liquid circulated through the third tank and the third pipe.

15. The substrate processing apparatus according to claim 12,
- wherein the first liquid storage further comprises a cooler which cools the sulfuric acid-containing liquid circulated through the first tank and the second pipe.

16. The substrate processing apparatus according to claim 12, wherein the sulfuric acid-containing liquid circulated through the first tank and the second pipe is cooled only through natural cooling.

17. The substrate processing apparatus according to claim 12,
- wherein the second liquid storage further comprises a sulfuric acid concentration meter which measures a sulfuric acid concentration of the sulfuric acid-containing liquid circulated through the second tank and the first pipe.

18. The substrate processing apparatus according to claim 12, further comprising:
- a sulfuric acid-containing liquid supply pipe which connects the second tank or the first pipe to the mixing portion; and
- a third heater which heats a sulfuric acid-containing liquid flowing through the sulfuric acid-containing liquid supply pipe.

19. The substrate processing apparatus according to claim 12, further comprising:
- a mixing ratio changing unit which changes a ratio of the sulfuric acid-containing liquid to hydrogen peroxide water in the mixing portion;
- a recovery pipe through which the liquid supplied to and expelled from the substrate held by the substrate holding unit is recovered to be supplied to the sulfuric acid-containing liquid supply device;
- a liquid drain pipe into which the liquid supplied to and expelled from the substrate held by the substrate holding unit flows; and
- a switching unit which switches, between the liquid drain pipe and the recovery pipe, a pipe into which the liquid expelled from the substrate held by the substrate holding unit flows.

20. The substrate processing apparatus according to claim 19, further comprising:
- a first guard which is connected to the liquid drain pipe and surrounds the substrate held by the substrate holding unit; and
- a second guard which is connected to the recovery pipe and surrounds the substrate held by the substrate holding unit,
- wherein the switching unit comprises a guard switching unit which switches the first guard and the second guard between a first state such that the liquid expelled from the substrate is received by the first guard and a second state such that the liquid expelled from the substrate is received by the second guard.

* * * * *